(12) United States Patent
Nguyen et al.

(10) Patent No.: US 6,236,281 B1
(45) Date of Patent: May 22, 2001

(54) Q-CONTROLLED MICRORESONATORS AND TUNABLE ELECTRONIC FILTERS USING SUCH RESONATORS

(75) Inventors: Clark Tu-Cuong Nguyen, Berkeley; Roger T. Howe, Lafayette, both of CA (US)

(73) Assignee: The Regents of the University of California, Berkeley, CA (US)

( * ) Notice: Subject to any disclaimer, the term of this patent is extended or adjusted under 35 U.S.C. 154(b) by 0 days.

(21) Appl. No.: 09/401,337

(22) Filed: Sep. 21, 1999

Related U.S. Application Data

(62) Division of application No. 08/473,342, filed on Jun. 6, 1995, now Pat. No. 5,955,932, which is a division of application No. 07/989,396, filed on Dec. 11, 1992, now Pat. No. 5,491,604.

(51) Int. Cl.[7] .............................. H03B 5/30; H03H 9/205; H01G 5/011
(52) U.S. Cl. ................ 331/154; 331/116 M; 331/177 V; 333/186; 361/278
(58) Field of Search .......................... 331/116 R, 116 FE, 331/116 M, 154–156, 177 R, 177 V; 333/186, 197, 219; 361/278, 296

(56) References Cited

U.S. PATENT DOCUMENTS

| | | |
|---|---|---|
| 2,803,800 | 8/1957 | Vilbig . |
| 3,056,890 | 10/1962 | Stoops et al. . |
| 3,490,056 | 1/1970 | Warren et al. . |
| 3,517,349 | 6/1970 | Engeler et al. . |
| 3,634,787 | 1/1972 | Newell . |
| 4,262,269 | 4/1981 | Griffin et al. . |
| 4,282,498 | 8/1981 | Lizawa . |
| 4,517,486 | 5/1985 | Andrews . |
| 4,522,893 | 6/1985 | Bohlen et al. . |
| 4,581,592 | 4/1986 | Bennett . |
| 5,025,346 | 6/1991 | Tang et al. . |
| 5,090,254 | 2/1992 | Guckel et al. . |
| 5,349,855 | 9/1994 | Bernstein et al. . |
| 5,408,877 | 4/1995 | Greiff et al. . |
| 5,455,547 | 10/1995 | Lin et al. . |
| 5,491,604 | 2/1996 | Nguyen et al. . |
| 5,537,083 | 7/1996 | Lin et al. . |
| 5,550,516 | 8/1996 | Burns et al. . |
| 5,767,405 | * 6/1998 | Bernstein et al. ............... 73/504 |

OTHER PUBLICATIONS

Tang et al., "Laterally Driven Polysilicon Resonant Microstructures", Sensors and Actuators, 89, pp. 25–32.

Lin et al., "Micro Electromechanical Filters for Signal Processing", Micro Electro Mechanical Systems 92' pp. 226–231, Feb. 1992.

B.S. Song et al., "Switched–Capacitor High—Q Bandpass Filters for IF Applications", IEEE J. Solid State Circuits, vol. SC–21, Dec. 1986, pp. 924–933.

K. Suzuki et al., "Alternative Process for Silicon Linear Micro–Actuators", Proceedings, 9th Sensor Symposium, IEEE Japan, Tokyo, Jun. 1990, pp. 125–128.

R.T. Howe, "Resonant Microsensors", Technical Digest, 4th International Conference on Solid State Sensors and Actuators, Tokyo, Japan, Jun. 2–5, 1987, pp. 843–848.

C.T.C. Nguyen, "Electromechanical characterization of Microresonators for Circuit Applications," M.S. Report, Dept. of Electrical Engineering and Comp. Sciences, Univ. of CA Berkeley, Apr. 1991.

(List continued on next page.)

*Primary Examiner*—David Mis
(74) *Attorney, Agent, or Firm*—Fish & Richardson, P.C.

(57) ABSTRACT

A Q-controlled microresonator and devices including such resonators.

7 Claims, 21 Drawing Sheets

OTHER PUBLICATIONS

K.R. Laker et al., "A Comparison of Multiple–Loop Feedback Techniques for Realizing High–Order Bandpass Filters", IEEE Trans. Circuits and Syst., vol. CAS–21, Nov. 1974, pp. 774–783.

W. Yun et al., "Surface Micromachined. Digitally Force–Balanced Accelerometer with Integrated CMOS Detection Circuitry", Tech. Digest IEEE Solid–State Sens. & Act. Workshop, Hilton Head Is. SC, Jun. 22–25, 1992, pp. 126–131.

M. Banu et al., "Fully Integrated Active RC Filters in MOS Technology", IEEE J. Solid–State Cir. vol. SC–18, Dec. 18, 1983, pp. 644–651.

M.E. Frerking, Crystal Oscillator Design and Temperature Compensation, N.Y., 78.

C.H. Mastrangelo et al., "Vacuum–Sealed Silicon Micromachined Incandescent Light Source", Tech. Digest, IEEE Inter. Electron Dev. meeting Wash. D.C. Dec. 1989, pp.503–506.

M.A. Huff et al., "A Thermally isolated Microstructure Suitable for Gas Sensing Applications", Technical Digest, IEEE Solid–State Sensor and Actuator Workshop, Hilton Head Island, SC, Jun. 6–9, 1988, pp. 47–50.

K. Suzuki, "Single–Crystal Silicon Micro–Actuators", Tech. Digest, IEEE Int. Electron Devices Meeting. SF, CA, Dec. 10–14, 1990, pp. 625–628.

R. Adler, "Compact Electromechanical Filters", Electronics, vol. 20, Apr. 1947, pp. 100–105.

J.C. Hathaway et al., "Survey of Mechanical Filters and Their Applications," Proc. IRE, vol. 45, Jan. 1957, pp. 5–16.

R.A. Johnson et al., "Mechanical Filters–A Review of Progress", IEEE Trans. Sonics Ultrason., vol. Su–18, Jul. 1971, pp. 155–170.

W. Yun et al., "Fabrication Technologies for Integrated Microdynamic Systems", Int. Micro–Mot.–Syst. Micromach., Control and Apps., Sci. Publ., 1990, pp. 297–312.

G.K. Fedder, et al., "Thermal Assembly of Polysilicon Microstructures", IEEE Micro Electro Mechanical Systems Workshop Nara. Japan, Jan.–Feb., 1991.

H.C. Nathanson et al., "The Resonant Gate Transistors", IEEE Trans. Electron Devices, vol. ED–14, Mar. 67, pp. 117–133.

* cited by examiner

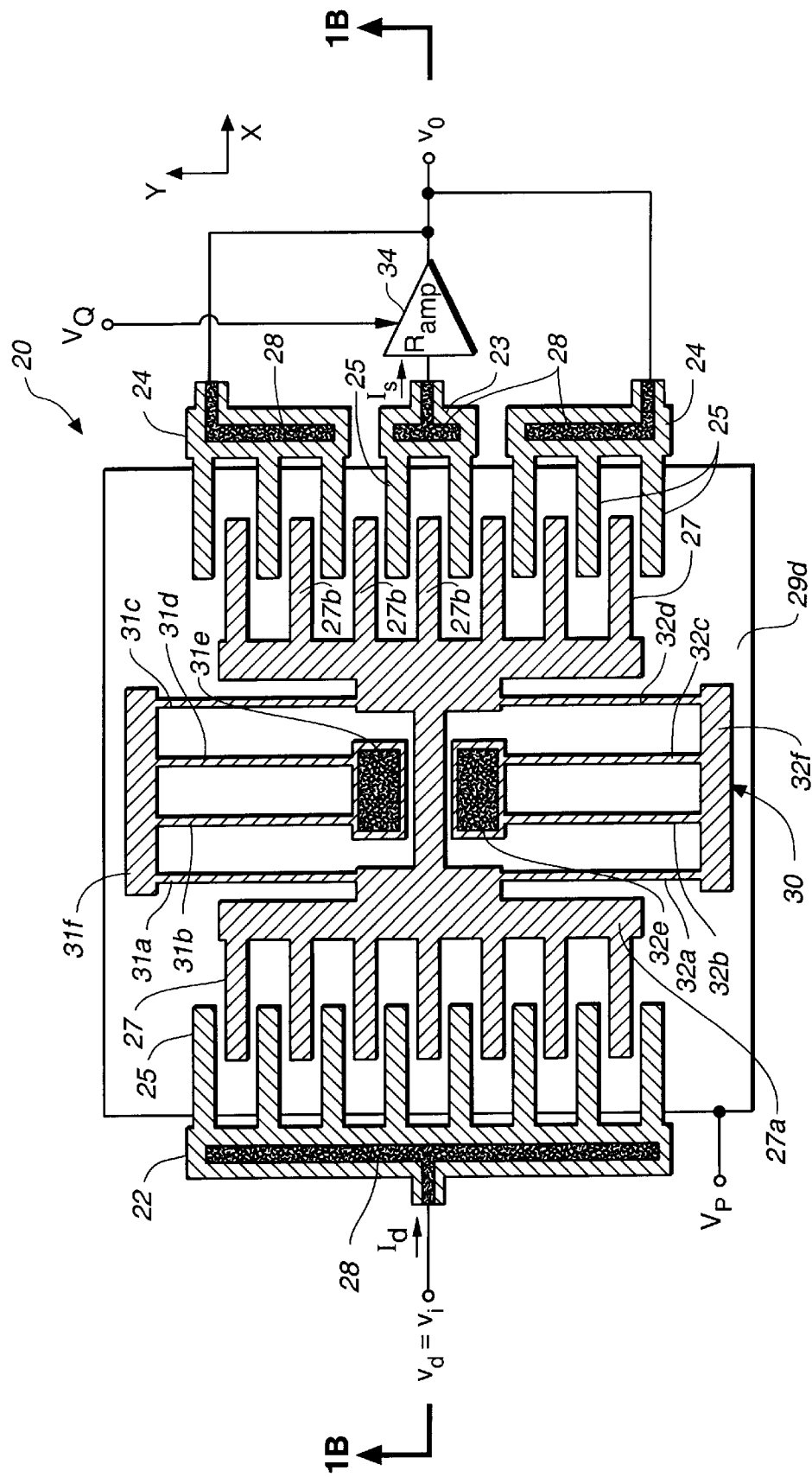
FIG._1A

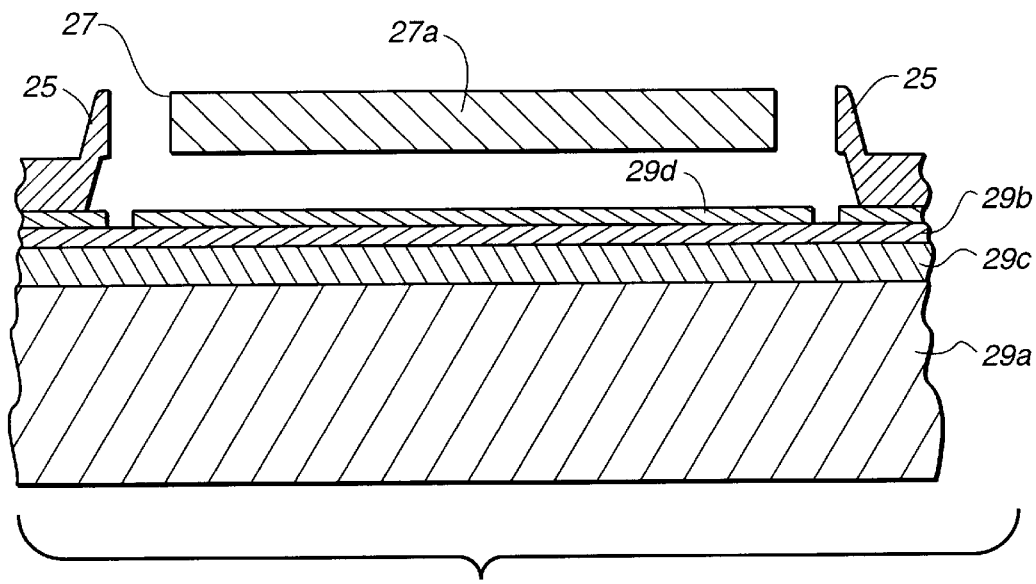
FIG._1B
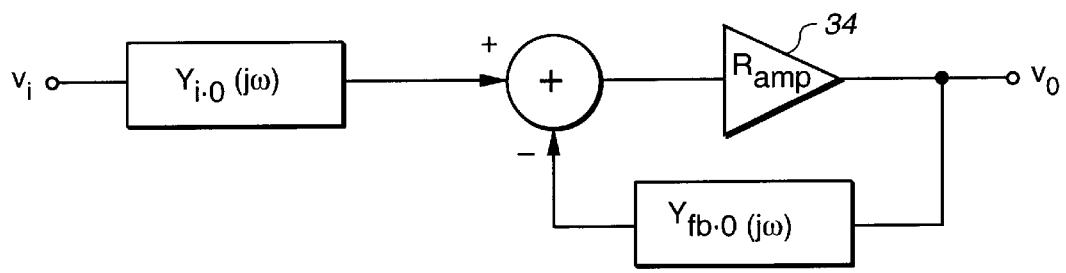
FIG._2

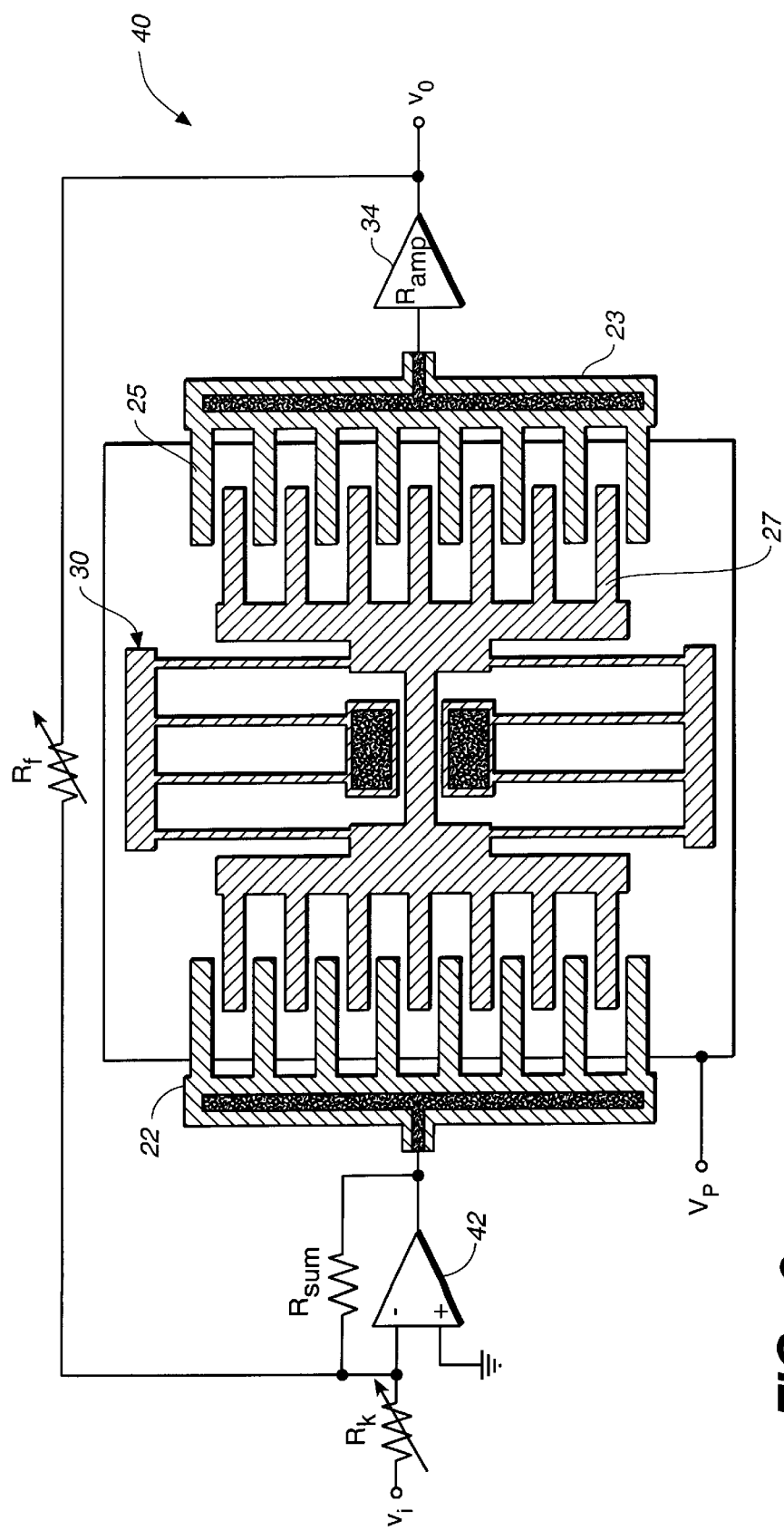
FIG._3

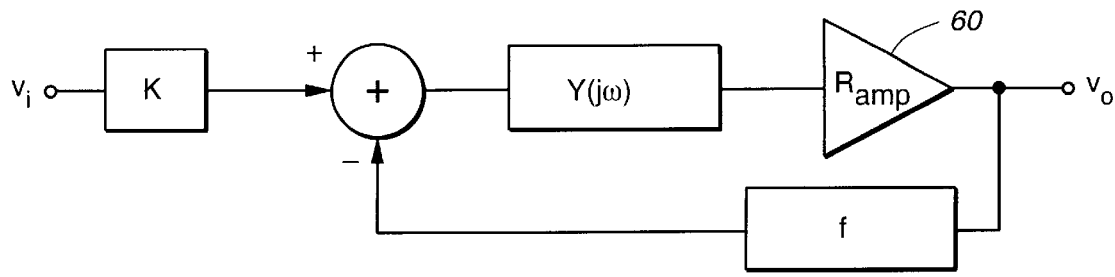
FIG._4
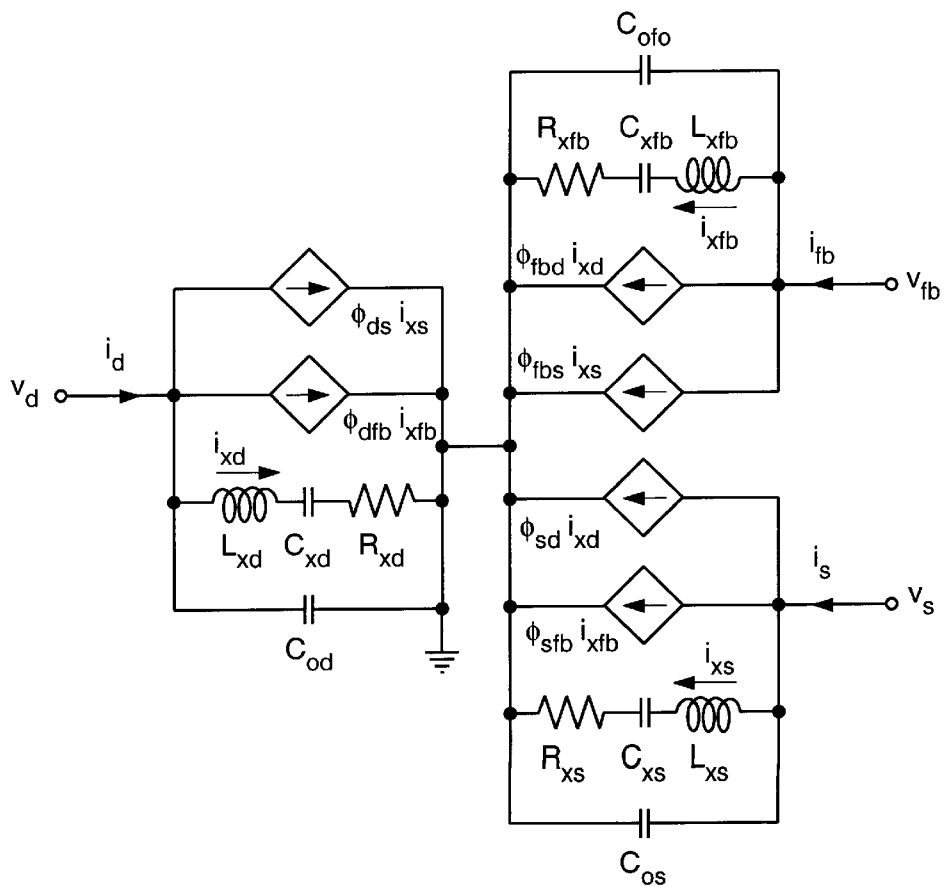
FIG._6

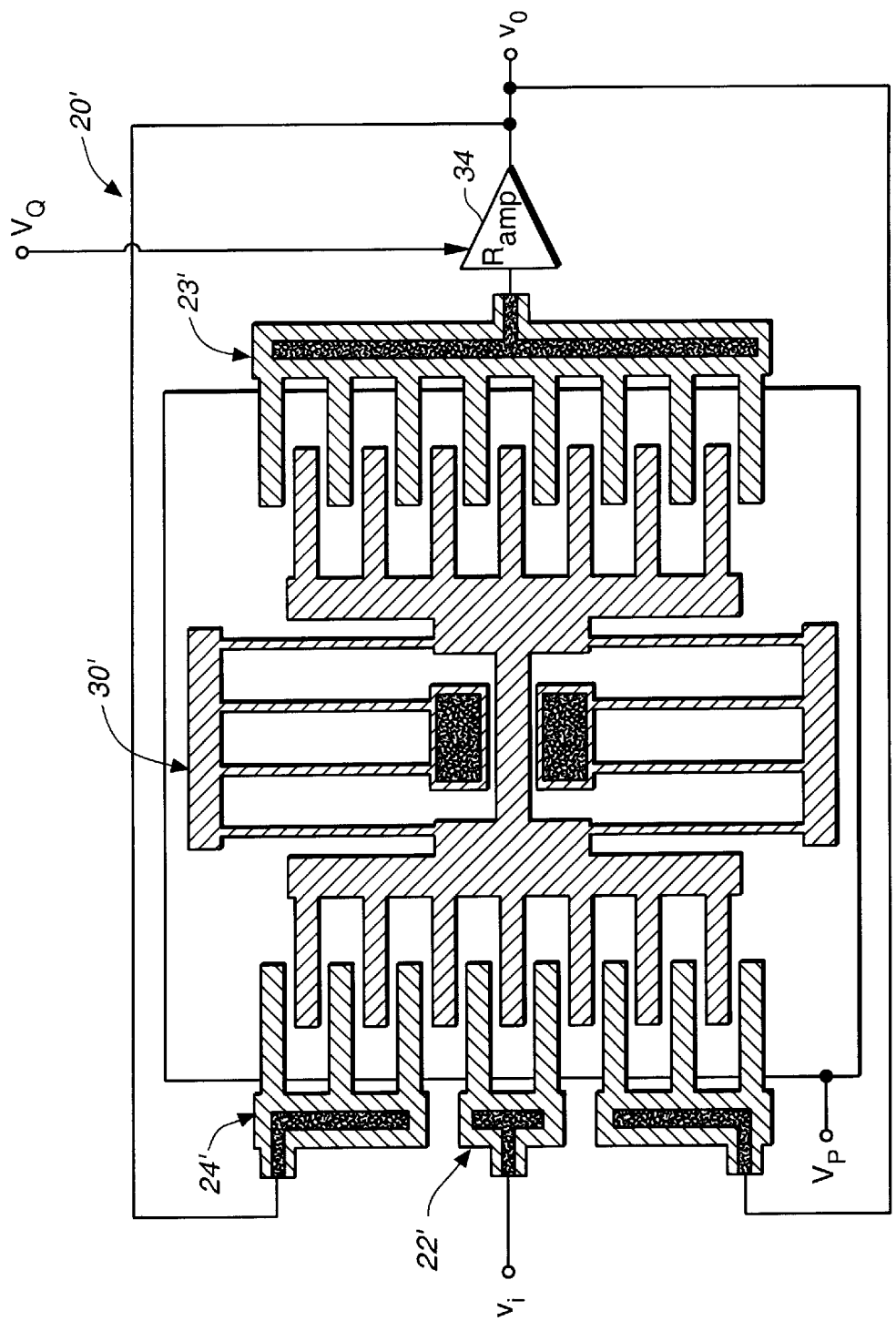
FIG._5

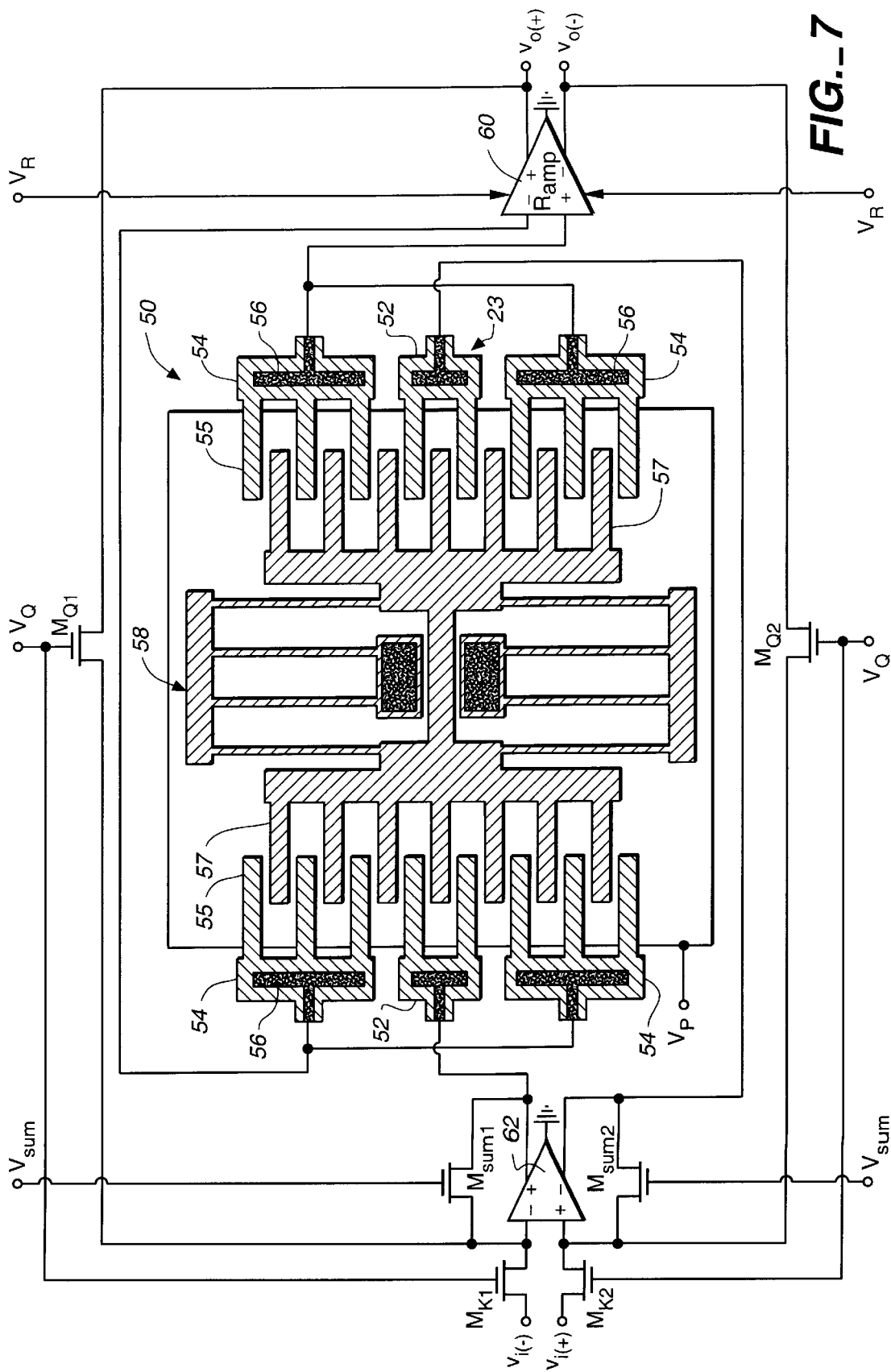
FIG._7

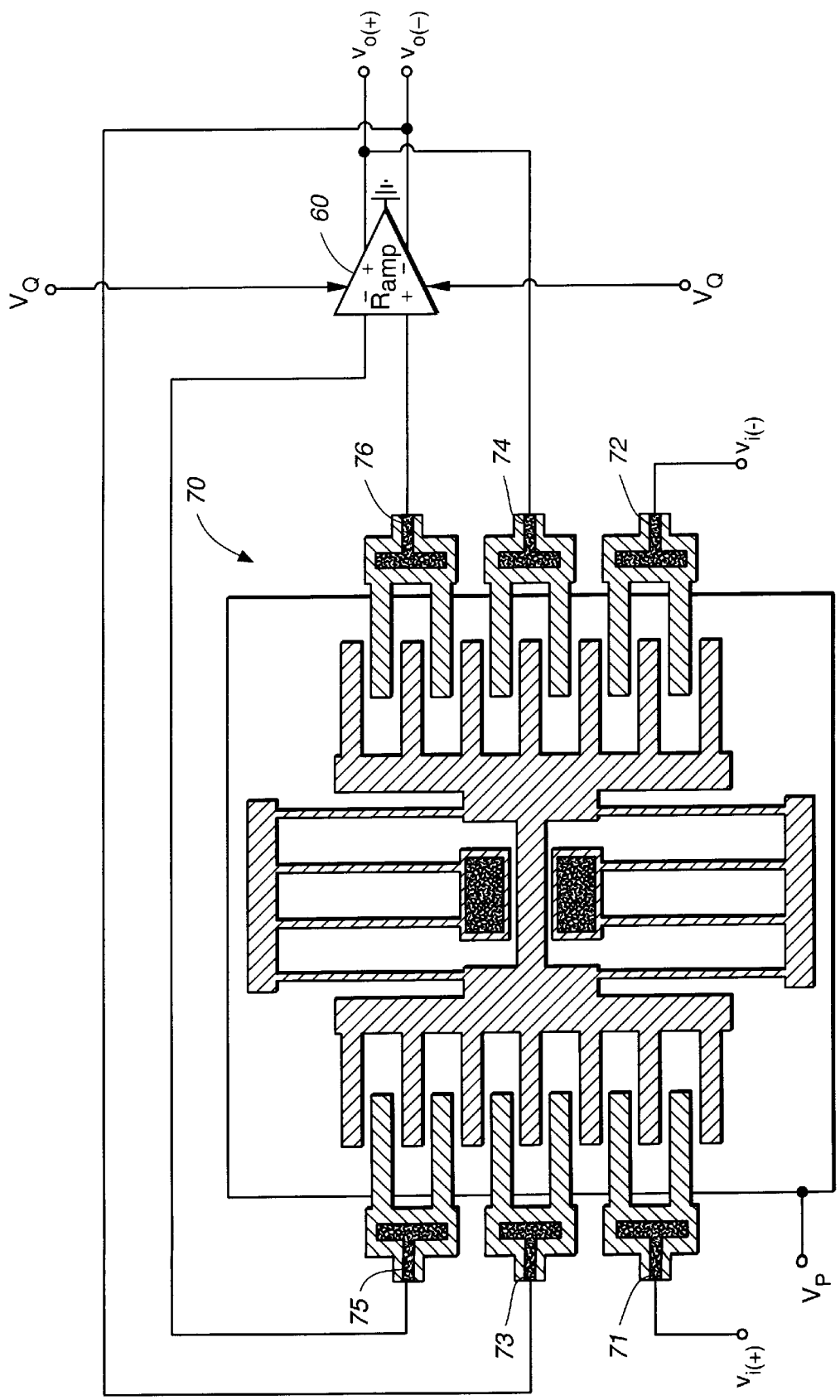
FIG._8

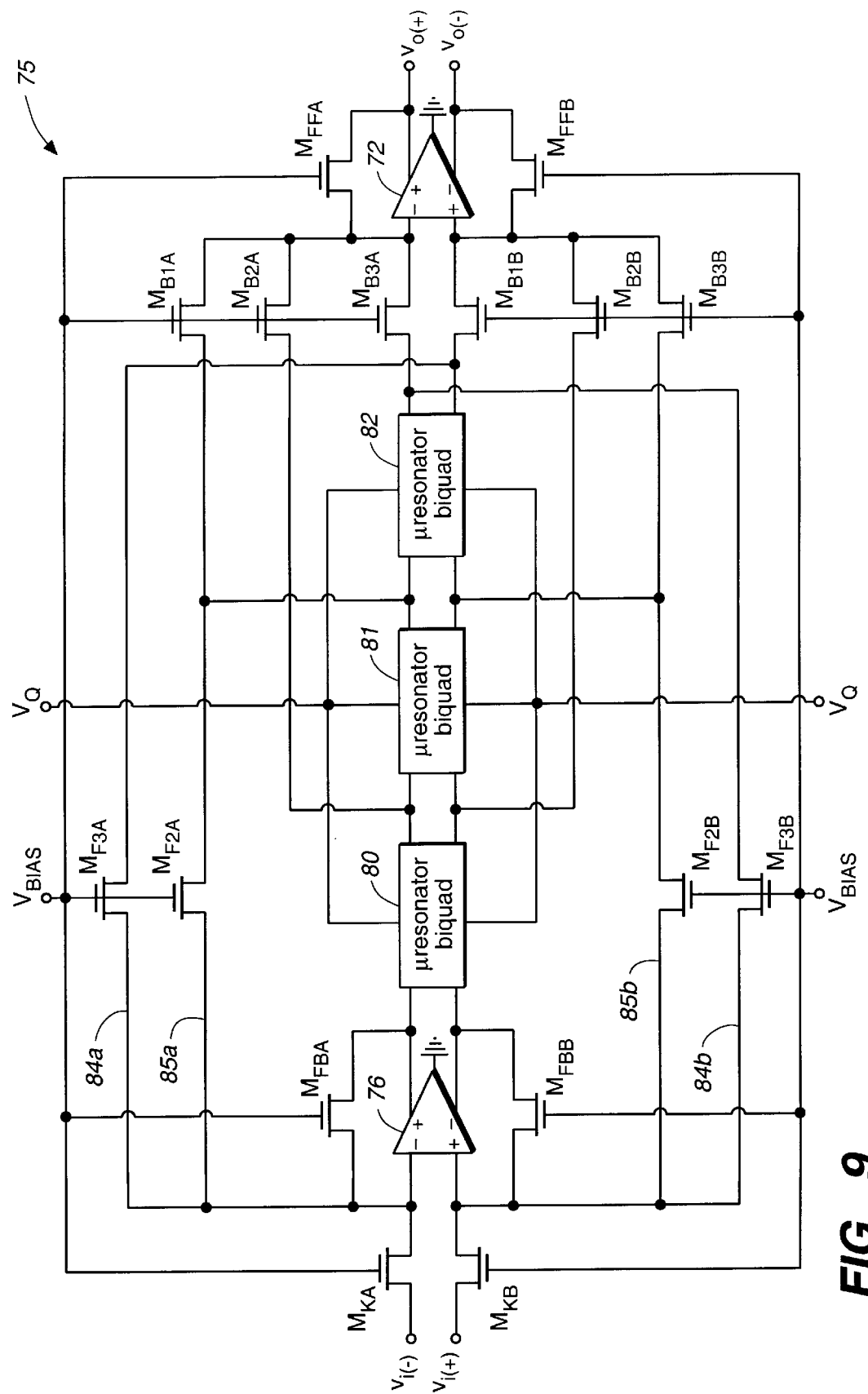
FIG._9

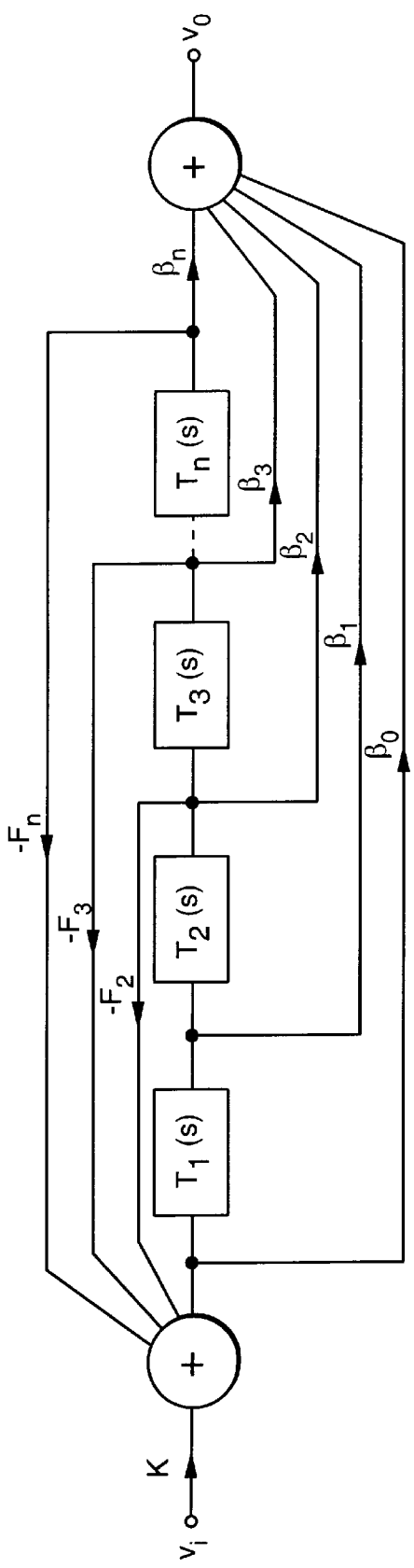
FIG._10A
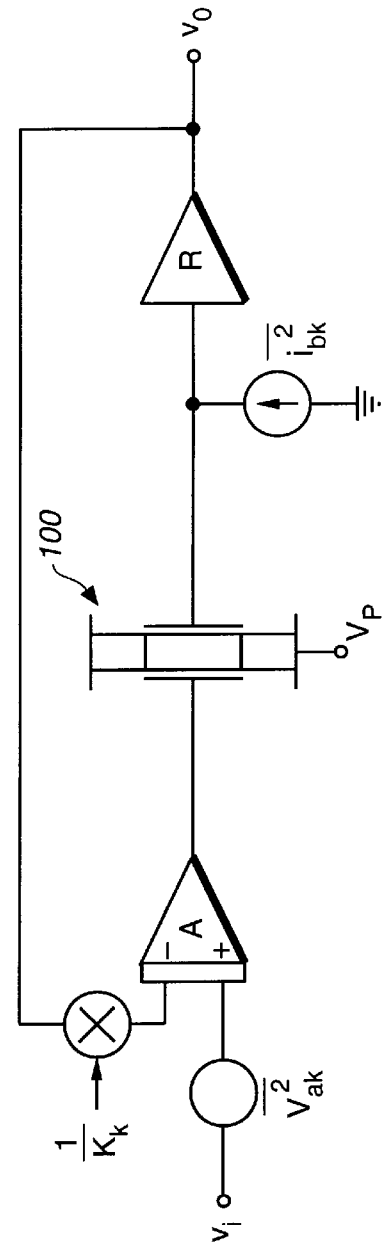
FIG._10B

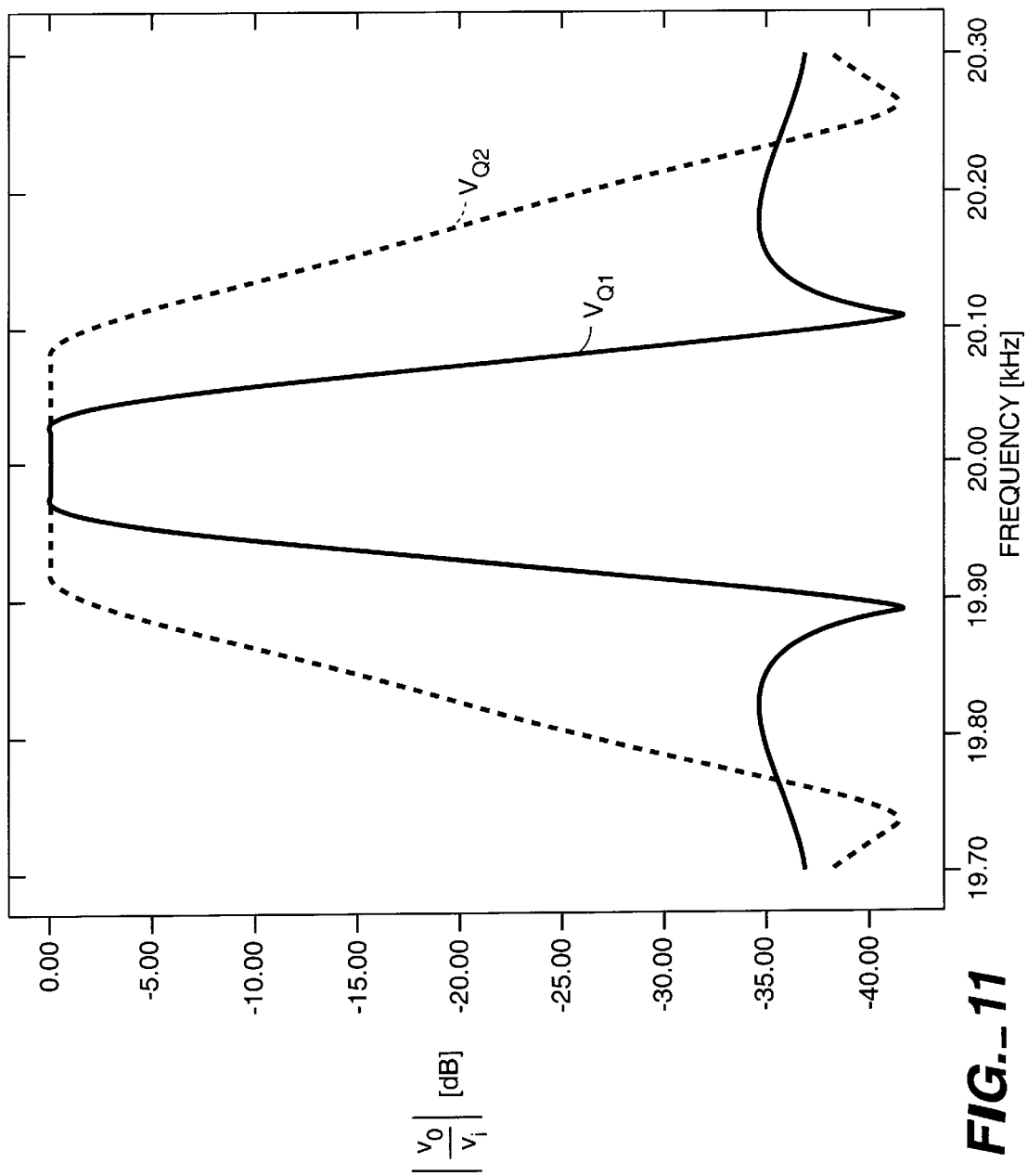
FIG._11

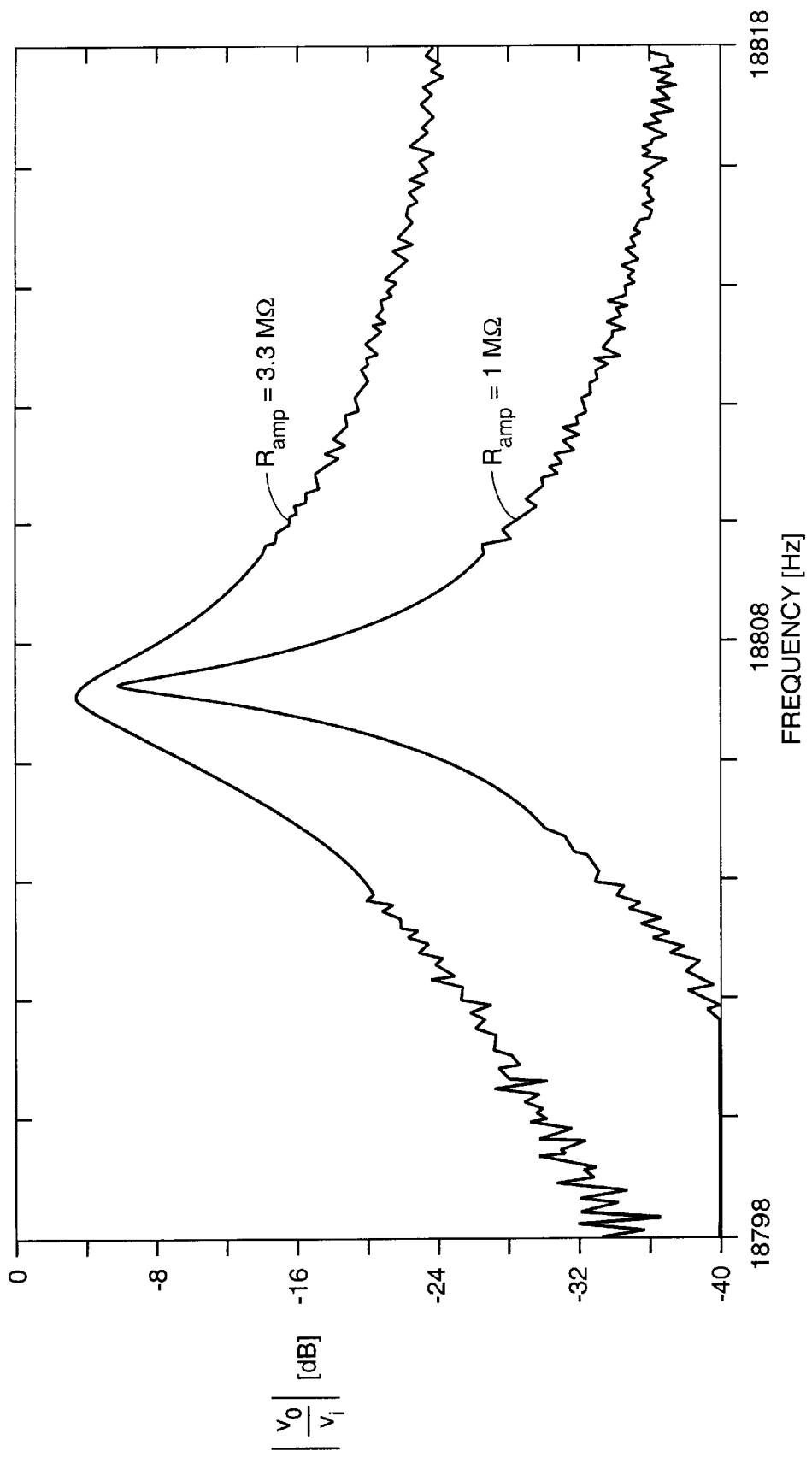
FIG._12

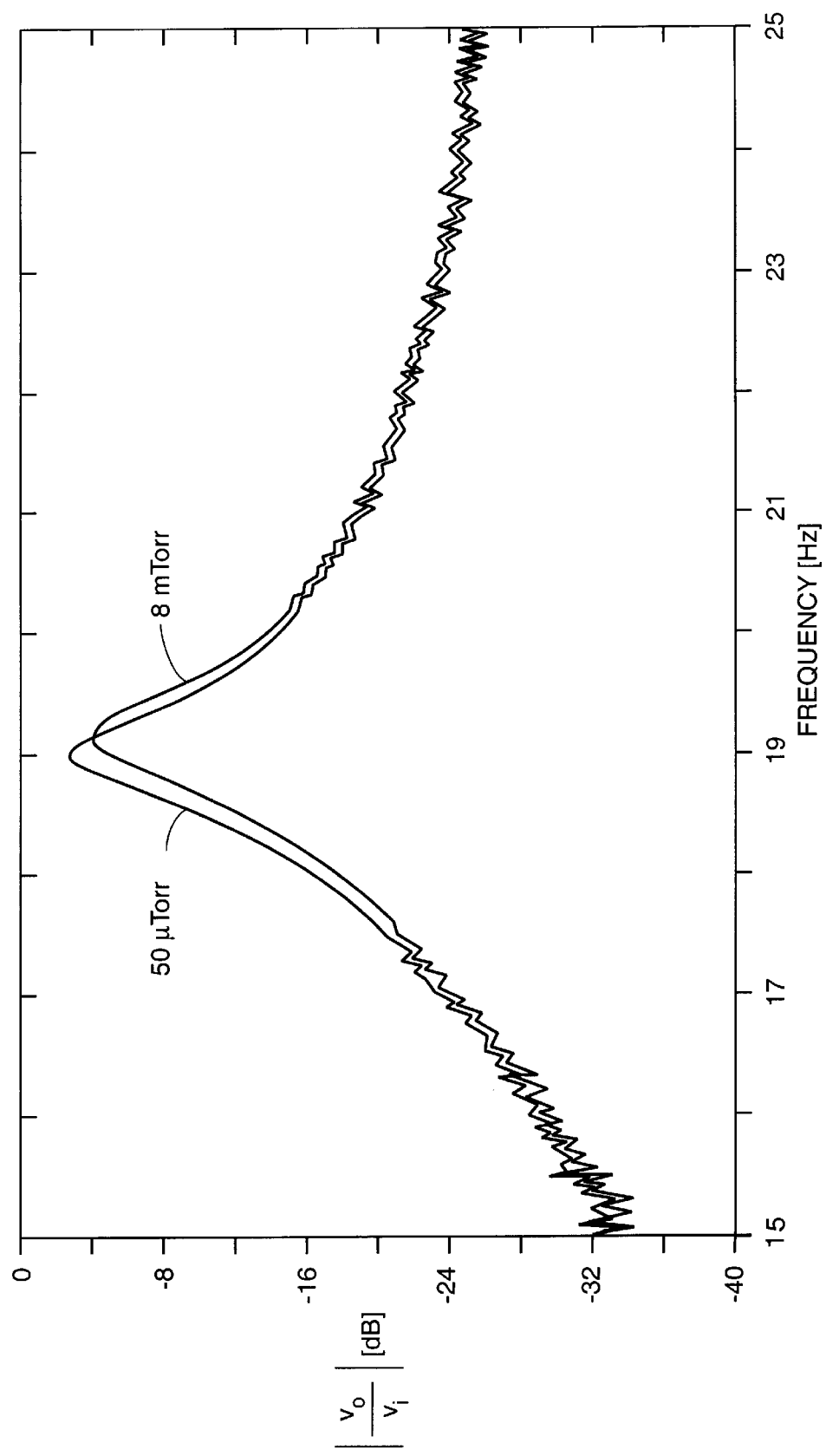
FIG._13

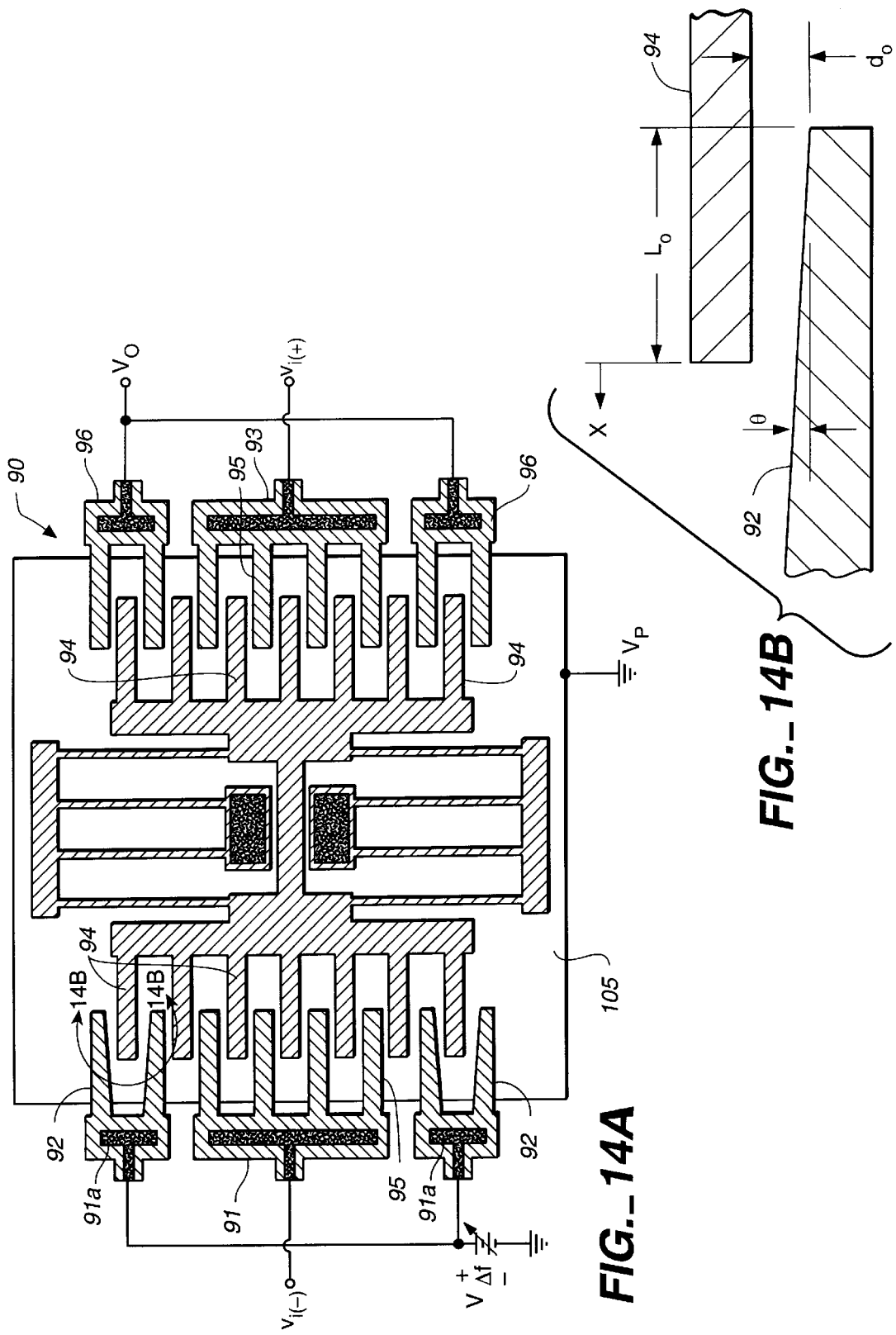

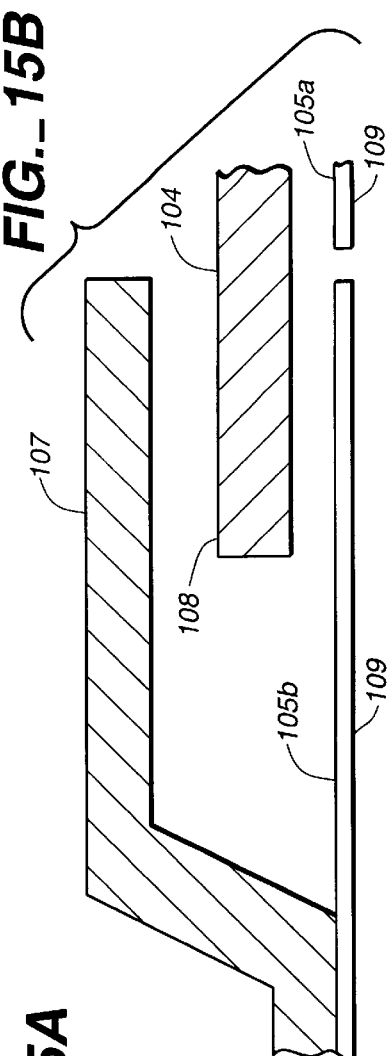
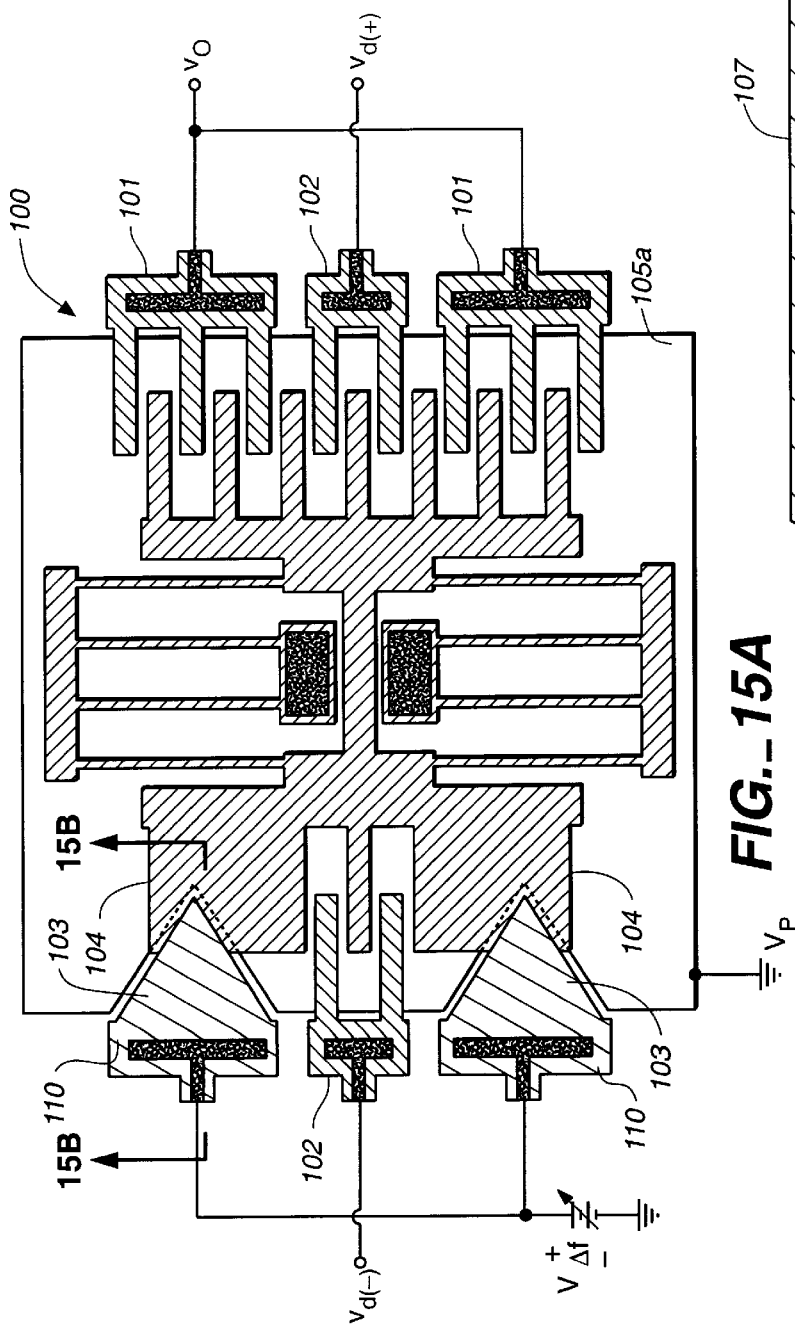

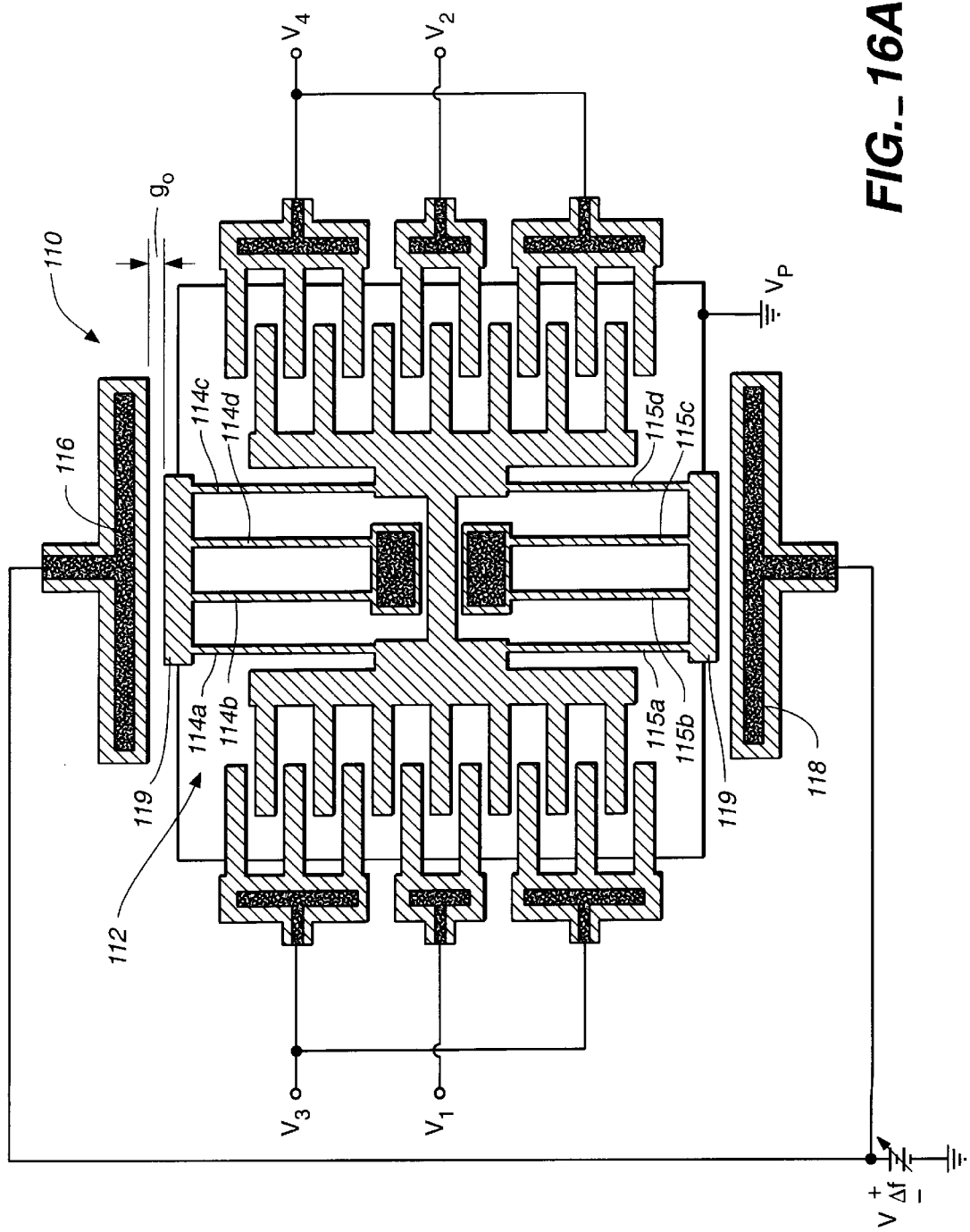
FIG._16A

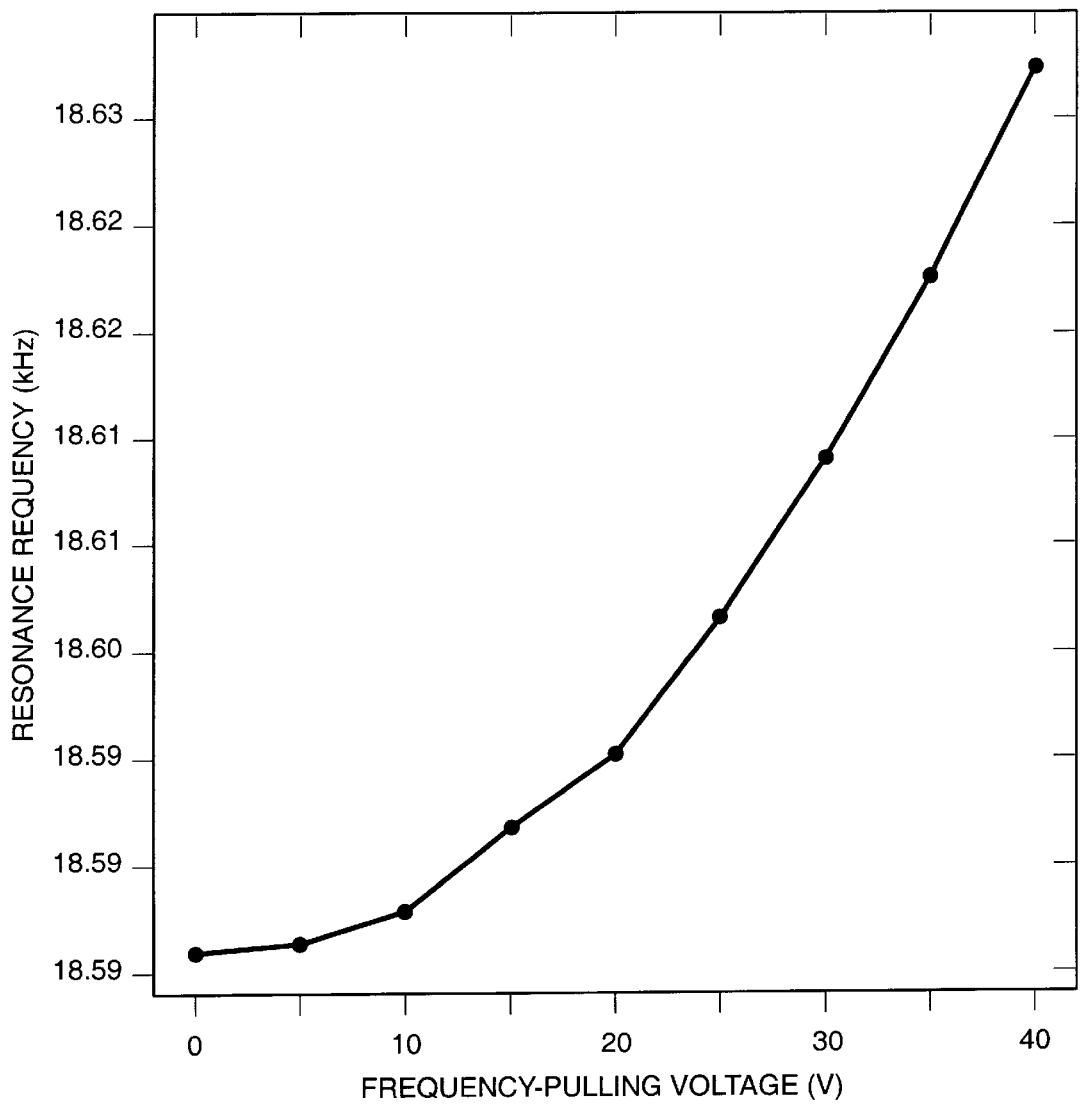
FIG._16B

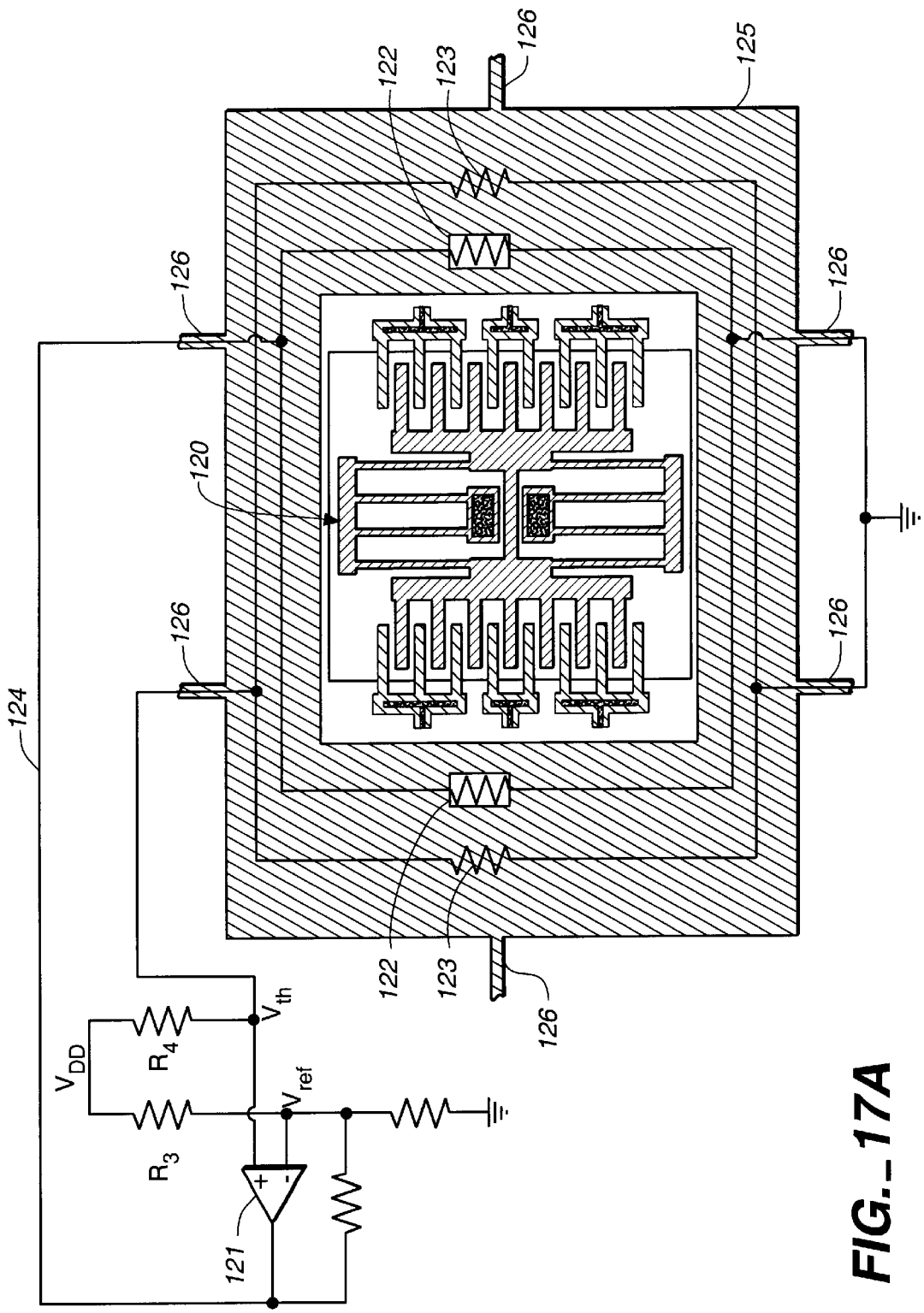
FIG._17A

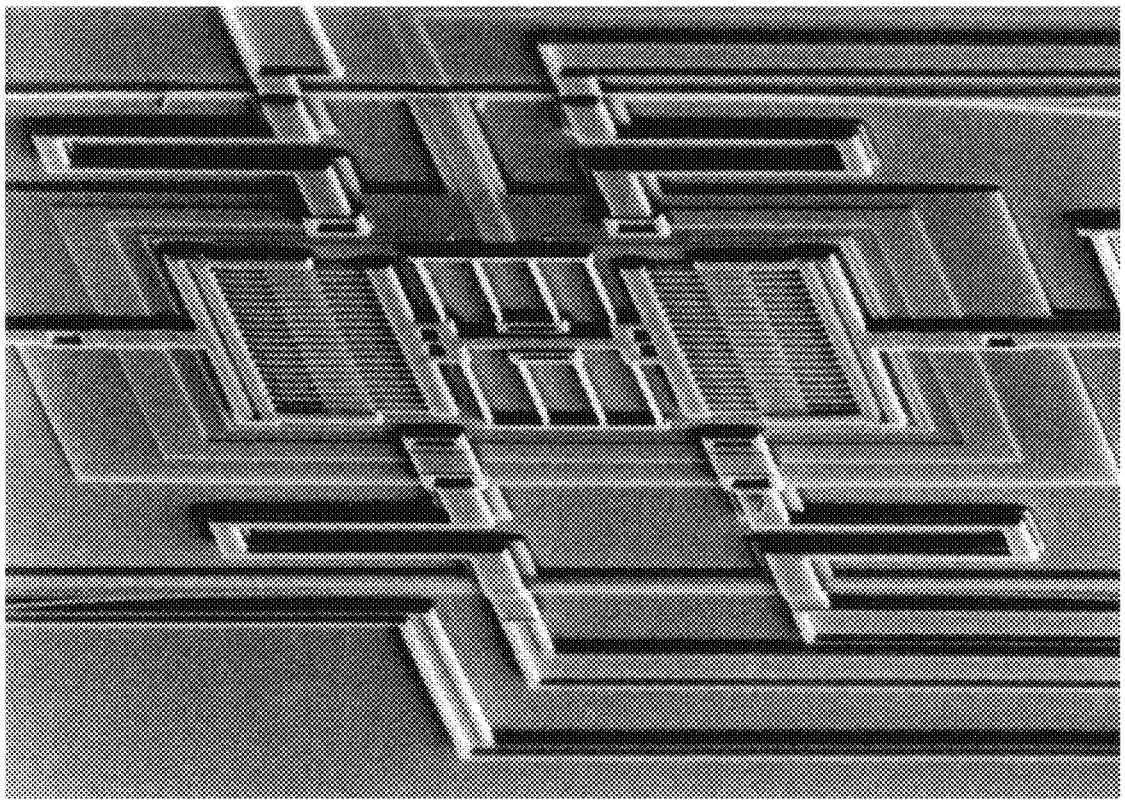
*FIG._17B*

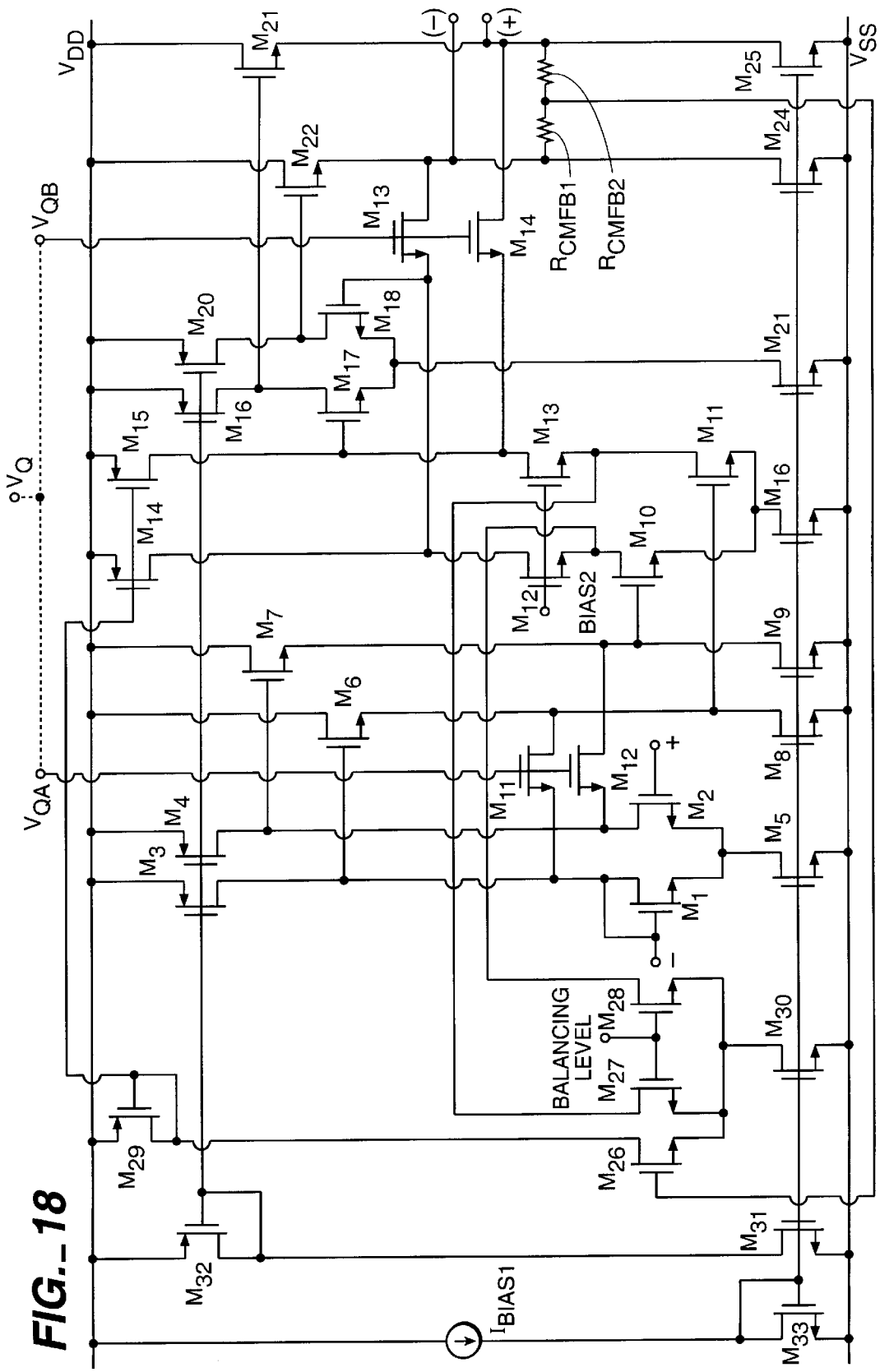
FIG._18

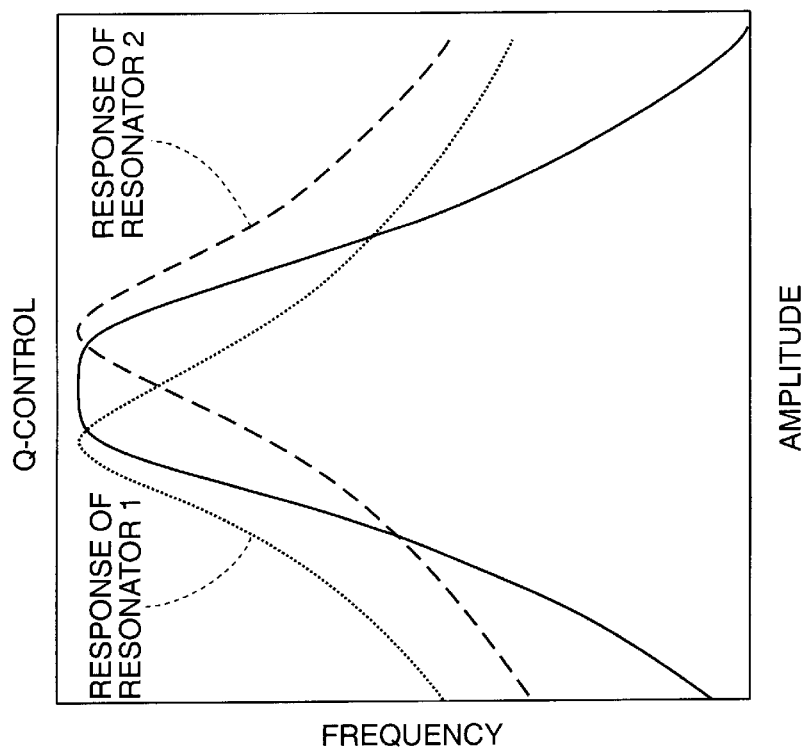
FIG._19B
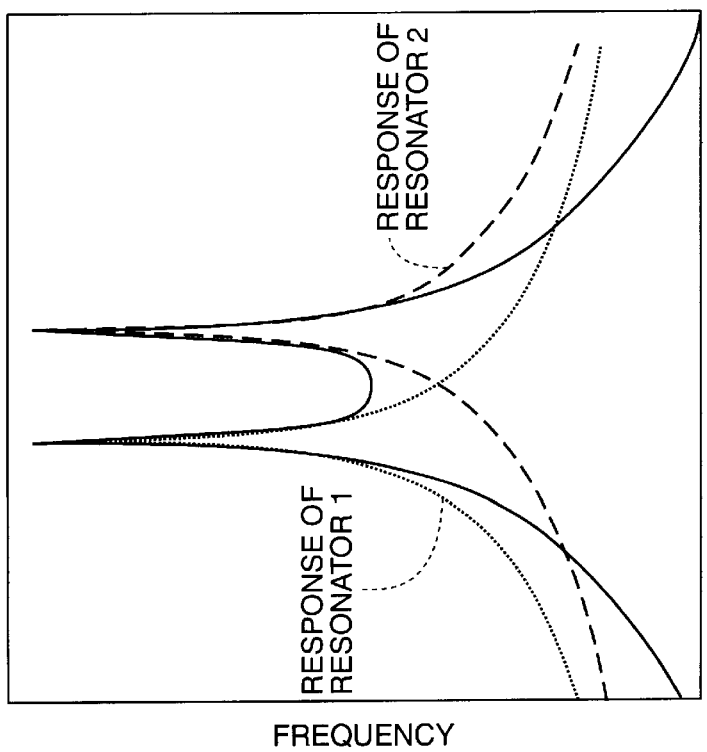
FIG._19A

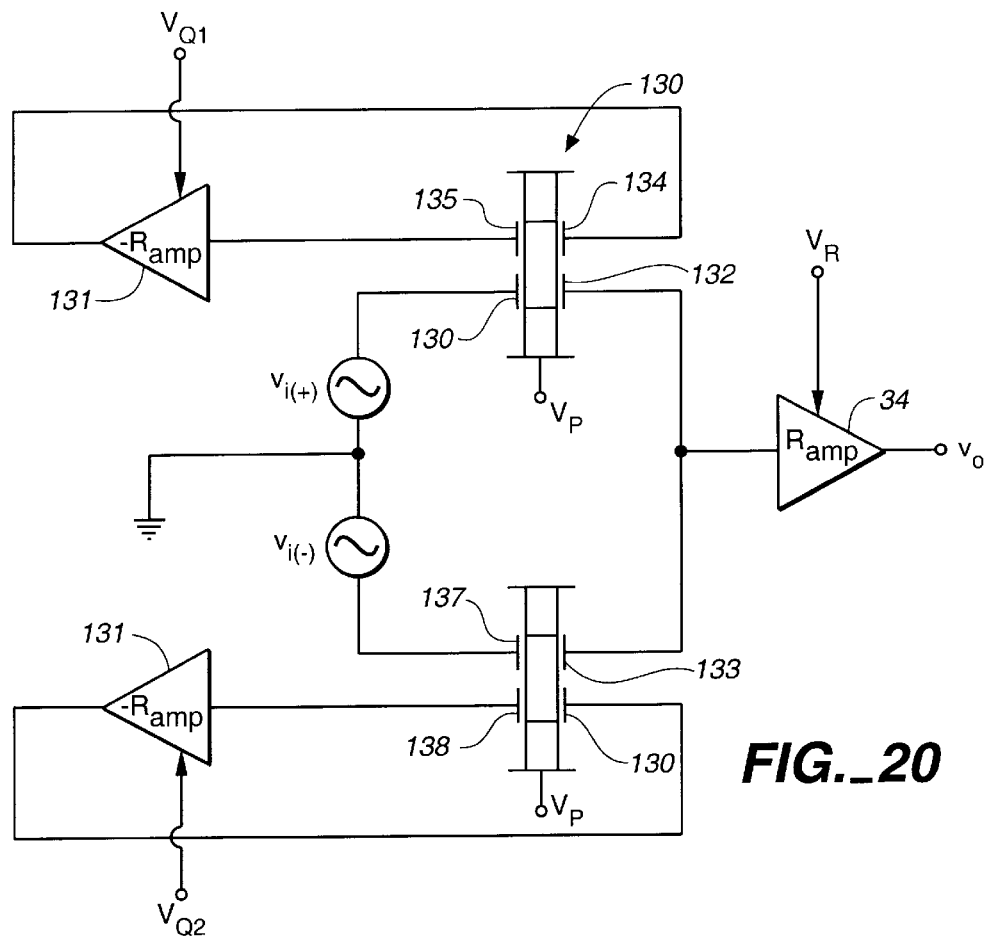
FIG._20
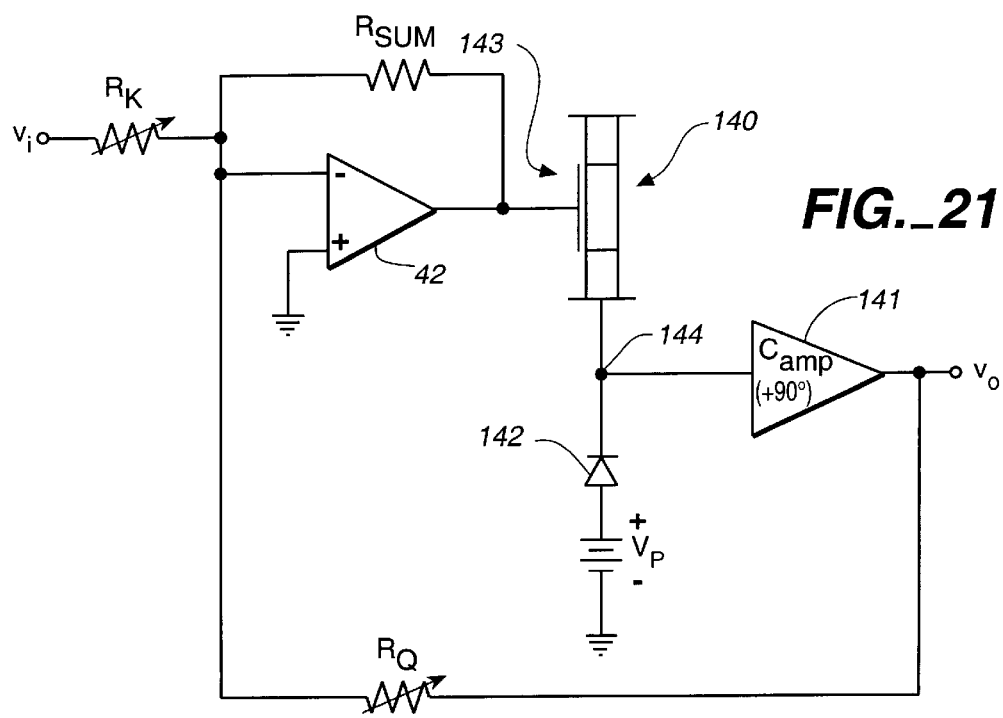
FIG._21

Q-CONTROLLED MICRORESONATORS AND TUNABLE ELECTRONIC FILTERS USING SUCH RESONATORS

CROSS-REFERENCE TO RELATED APPLICATIONS

This application is a division of U.S. application Ser. No. 08/473,342, filed Jun. 6, 1995, now U.S. Pat. No. 5,955,932, which is a division of U.S. application Ser. No. 07/989,396, filed Dec. 11, 1992, now U.S. Pat. No. 5,491,604.

This application is related to a co-pending, commonly-owned application entitled "Microlectro-mechanical Signal Processors," filed on Dec. 11, 1992. The entire disclosure of this application is hereby incorporated by reference.

BACKGROUND OF THE INVENTION

The present invention relates generally to resonant microstructures, and more particularly to Q-control for resonant microstructures and electronic filters using such microstructures.

The need for high-frequency bandpass filters with high selectivity for telecommunication systems has stimulated interest in integrated versions of such filters wherein entire systems may be integrated onto a single silicon chip. Examples of systems requiring these filters include radio-frequency (RF) receiver systems, mobile phone networks, and satellite communication systems.

Previously, intermediate frequency (IF) filtering in frequency modulated (FM) receivers has been performed at 10.7 Mega-Hertz (MHz) IF frequency, using highly selective inductive-capacitance (LC) ceramic or crystal filters. Recently, integrated versions using integrated circuit (IC) switched-capacitor techniques have been attempted. However, designs based upon a coupled biquad filter architectures suffer from dynamic range reduction introduced when attempting high-Q operational simulation of LC stages. (Q is a figure of merit equal to reactance divided by resistance. The Q of a system determines the rate of decay of stored energy.) Modulation filtering techniques, such as N-path designs, suffer from the generation of extraneous signals, such as image and clock components inside the signal band, resulting from the remodulation process.

Recent advances in micromachining offer another analog, high frequency, high-Q, tunable integrated filter technology that can enhance filter performance over that of previous integrated versions while maintaining design characteristics appropriate for bulk fabrication in very large-scale integrated (VLSI) systems. Specifically, micromachined mechanical resonators or resonant microstructures may be used. These microresonators are integrated electromechanical devices with frequency selectivity superior to integrated resistance-capacitance (RC) active filtering techniques. Using integrated micromechanical resonators, which have Q-factors in the tens of thousands, microelectromechanical filters with selectivity comparable to macroscopic mechanical and crystal filters may be fabricated on a chip.

Since the passband shape of these filter designs depends strongly on the Q of the constituent resonators, a precise technique for controlling resonator Q is required to optimize the filter passband. Such a Q-control technique would be most convenient and effective if the Q was controllable through a single voltage or an element value, e.g., a resistor, and if the controlled value of Q was independent of the original Q.

An object of the present invention is thus to provide feedback techniques for precise control of the Q-factor of a micromechanical resonator.

Another object of the present invention is to provide very high Q microelectromechanical filters constructed of Q-controlled microresonator biquads in biquad filter architectures. In addition, the invention provides a means for passband correction of spring-coupled or parallel micromechanical resonators via control over the Q-factor of the constituent resonators.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a resonator structure. The resonator structure comprises a first electrode at which an input signal may be applied and a second electrode at which an output signal may be sensed. The resonator structure further includes a feedback means for applying the output signal to the first electrode for controlling the Q of the resonator structure.

The equivalent circuit series resistance ($R_X$) of the resonator of the present invention is proportional to the inverse of the Q of the resonator. As such, the controlled value of Q is independent of the original Q of the resonator. Rather, it is dependent only on the control voltage ($V_Q$) or some other controlling factor such as resistance values.

Additionally, the gain of the resonator ($v_0/v_i$) is equal to the number of input fingers divided by the number of feedback fingers. This is advantageous in that it offers very precise gain values. This enables construction of bandpass biquads with precisely settable gains. Also, the gain will stay constant as the Q is changed.

Dimensions of a microresonator of the present invention may be: a length between about 5 microns ($\mu$m) and 1000 $\mu$m, a width between about 5 $\mu$m and 100 $\mu$m, and a thickness from between about 0.1 and 100 $\mu$m.

High-Q tunable electronic filters based upon the Q-controlled microresonators of the present invention are suitable for batch fabrication using standard complementary metal-oxide semiconductor (CMOS) integrated circuit and micromachining technologies. The Q-controlled microresonators may serve as adjustable biquad stages in various filter architectures such as coupled (or cascaded) biquad, follow-the-leader feedback (FLF), or other multiple-loop feedback techniques. Frequency and bandwidth are independently voltage-controllable. This permits adaptive signal processing.

Noise analysis determines that the dynamic range of a proposed high-Q filter is much higher than that of its high-Q active RC counterparts, i.e., switched-capacitor MOSFET-C, and $g_m$-C filters. Specifically, a dynamic range in excess of 90 decibels (dB) is predicted for a filter centered at 10.7 MegaHertz (MHz) with a bandwidth of 56 KiloHertz (kHz).

With the resonators of the present invention, temperature insensitivity can be achieved through micro-oven control, which, on a micron scale, provides orders of magnitude improvement in power dissipation and thermal time constant over equivalent macroscopic methods.

BRIEF DESCRIPTION OF THE DRAWINGS

The accompanying drawings, which are incorporated in and constitute a part of the specification, schematically illustrate a preferred embodiment of the invention and, together with a general description given above and the detailed description of the preferred embodiment given below, will serve to explain the principles of the invention.

FIG. 1A is a schematic representation of a Q-control scheme for a three-port electrostatic-comb driven microresonator.

FIG. 1B is a schematic cross-section along lines 1B—1B of FIG. 1A.

FIG. 2 is a system block diagram for the circuit of FIG. 1A.

FIG. 3 is a schematic representation of a Q-control scheme for a two-port microresonator.

FIG. 4 is a system block diagram for the circuit of FIG. 3.

FIG. 5 is a schematic representation of a scheme for raising the Q of a three-port microresonator.

FIG. 6 is an equivalent circuit diagram for a three-port microresonator biased and excited as shown in FIG. 1A.

FIG. 7 is a schematic representation of a balanced Q-control scheme for a four-port microresonator using two balanced amplifiers (one of them transimpedance) and metal oxide semiconductor (MOS) resistors.

FIG. 8 is a schematic representation of a balanced Q-control scheme for a six-port microresonator using one balanced transimpedance amplifier.

FIG. 9 is a schematic representation of a Q-controlled microresonator filter using a balanced FLF architecture.

FIG. 10A is a system block diagram for a general FLF filter.

FIG. 10B is a single-ended noise block diagram for the circuit of FIG. 3 or 6.

FIG. 11 is a graphical representation of simulated responses for the filter of FIG. 9.

FIG. 12 is a graphical representation of the measured transconductance spectra of the embodiment of FIG. 1A using different values of $R_{amp}$ and demonstrating control of the Q-factor through control of $R_{amp}$.

FIG. 13 is a graphical representation of the transconductance spectra for the microresonator of FIG. 1A subjected to Q-control with $R_{amp}=3.3$ mega-ohms and with varying ambient pressure.

FIG. 14A is a schematic representation of a microresonator including sloped drive fingers, which allow resonance frequency-pulling.

FIG. 14B is an enlarged schematic representation of the relationship between the sloped and straight drive fingers.

FIG. 15A is a schematic representation of a microresonator including a third polylayer to introduce a nonlinear variation in the voltage-to-force transfer function of the resonator and thus allow frequency-pulling.

FIG. 15B is a view along lines 15B—15B of FIG. 15A.

FIG. 16A is a schematic representation of a microresonator including spring-pulling electrodes for frequency tuning.

FIG. 16B is a graphical representation of resonance frequency versus frequency pulling voltage for the microresonator of FIG. 16A.

FIG. 17A is a schematic representation of feedback control circuitry for a micro-oven controlled resonator fabricated on a microplatform for thermal and mechanical isolation.

FIG. 17B is a scanning electron micrograph of a resonator fabricated on top of a thermally-isolated microplatform.

FIG. 18 is a circuit diagram of a high gain transresistance amplifier which may be used in the present invention.

FIGS. 19A and 19B are graphical representations of filter passband correction.

FIG. 20 is a circuit diagram showing the implementation of passband correction for a parallel microresonator filter.

FIG. 21 is a circuit diagram for Q control of a resonator structure with a single port.

DESCRIPTION OF THE PREFERRED EMBODIMENTS

The present invention will be described in terms of a number of different embodiments. It is directed to Q-control for microresonators. These resonators may be used to build very high Q microelectromechanical filters. The filters may be constructed of coupled, Q-controlled microresonator biquads, spring-coupled resonators or resonators electrically connected in parallel. Spring-coupled resonators and resonators electrically connected in parallel are described in the above-identified, co-pending application entitled "Microelectromechanical Signal Processors," which has been incorporated by reference.

A basic Q-control architecture for a microresonator 20 is shown in FIG. 1. The microresonator is of the type shown in U.S. Pat. No. 5,025,346, issued Jun. 18, 1991, which is hereby incorporated by reference.

The resonator shown in U.S. Pat. No. 5,025,346 is preferred in the context of the present invention. However, the principles of the present invention equally apply to other types of resonators, and the Q-control scheme discussed herein may be used with those resonators. Also the filter architectures, frequency-pulling schemes and micro-oven schemes discussed below may be applied to these other types of resonators. Such resonators include, but are not limited to, those which use piezoelectric, piezoresistive, parallel-plate electrostatic, or magnetic drive and sense, and to resonators with arbitrary geometries, such as cantilevers or double-ended tuning forks.

As shown in FIG. 1, resonator 20 has three ports, comprising a drive electrode 22, a sense electrode 23, and a feedback electrode 24. The resonator is driven electrostatically by the drive electrode and capacitive motional current is sensed at the sense electrode. Signals are fed back to the microresonator via the feedback electrode.

The electrodes comprise interdigitated finger (comb) structures 25 and 27. The fingers 25 are stationary, being anchored to a substrate 29a, which may be a silicon wafer substrate, or anchored to passivation layers, which may be a nitride layer 29b over an oxide layer 29c, over the substrate. The darkly shaded region 28 represents the anchor point for the drive electrode 22 and its associated fingers 25. The fingers 27 are attached to a suspended, movable shuttle 27a; thus, they are movable. The shuttle 27a and fingers 27 are spaced above the substrate, and are allowed to move laterally relative to the substrate overlayers and stationary fingers 25. A folded-beam suspension arrangement, represented generally by reference numeral 30, allows shuttle 27a and attached fingers 27 to move.

The folded beam suspension 30 comprises folded beams 31a, 31b, 31c, and 31d, and truss support beam 31f, all of which are suspended above the substrate 29a and associated overlayers 29b and 29c. Motivations for this truss suspension are its large compliance and its capability for relief of built-in residual strains in the structural film. The cantilever beams 31b and 31d are anchored at one end to a ground plane 29d, which is fabricated over the substrate 29a and substrate overlayers 29b and 29c, near a center point 31e (a darkly shaded region) and attached at the other end to the folding truss beam 31f. Cantilever beams 31a and 31c are attached at one end to the folding truss beam 31f and at the other to the shuttle 27a. The folded beam suspension 30 allows expansion or contraction of the four beams along the y-axis, increasing the linear range of operation of the resonator 20. The folded beam suspension 30, comprising 32a, 32b, 32c, 32d, and 32f, is anchored through beams 32b and 32c to ground plane 29d and/or overlayers 29b and 29c at location 32e, and the suspension operates like beams 31a–31f.

The long effective support length of beams 31a–31d and 32a–32d result in a highly compliant suspension for movable fingers 27 of the drive, sense, and feedback electrodes. In an alternate arrangement, the substrate overlayers may be eliminated. The anchor points would then be formed on the substrate, and the substrate would serve as the ground plane.

The motion of the movable fingers is sensed by detecting the notional current through the time-varying interdigitated finger capacitor formed by the movable and stationary fingers of the sense electrode 23 with a direct current (dc) bias voltage $V_P$ applied to ground plane 29b, which is attached to the shuttle 27a and movable fingers 27 through anchor points 31e and 32e. The driving force $F_x$ and the output sensitivity are proportional to the variation of the comb capacitance C with the lateral displacement x, $\partial c/\partial x$, of the structure.

A key feature of the electrostatic-comb drive is that $\partial C/\partial x$ is a constant, independent of the displacement x, so long as x is less than the finger overlap. Note that $\partial C/\partial x$ for a given port is a function of the number of overlaps between movable and stationary fingers 27 and 25, respectively, of the port in question. Thus, it can be different for drive port or drive electrode 28, sense port or sense electrode 23, and feedback port or feedback electrode 24. To distinguish these values, $(\partial C/\partial x)_d$, $(\partial C/\partial x)_s$, and $(\partial C/\partial x)_{fb}$ may be used for the drive, sense, and feedback ports, respectively.

At sense electrode 23, harmonic motion of the structure results in a sense current $I_s$ which is represented by:

$$I_S = V_P (\partial C/\partial x)_s (\partial x/\partial t) \quad (1)$$

At drive electrode 22, the static displacement is a function of drive voltage $v_D$ given by:

$$x = \frac{F_x}{k_{sys}} = \frac{1/2 v_D^2 (\partial c/\partial X)_d}{k_{SYS}} \quad (2)$$

where $F_x$ is the electrostatic force in the x direction and $k_{sys}$ is the system spring constant.

For a drive voltage $v_D(t) = V_P + v_d \sin(\omega t)$ the time derivative of x is $$\frac{\partial x}{\partial t} = \frac{(\partial C/\partial x)_d}{2k_{sys}} \frac{\partial (v_D^2)}{\partial t}$$

$$= \frac{(\partial C/\partial x)_d}{2k_{sys}} [2\omega V_P v_d \cos(\omega t) + \omega v_d^2 \sin(2\omega t)] \quad (3)$$

where $v_d$ is the amplitude of the input ac signal, $V_P$ is the previously-mentioned dc-bias applied to the resonator, and where the fact that $(\partial C/\partial x)_d$ is a constant for the interdigitated-finger capacitor 23 or 24 is used. The second-harmonic term on the right-hand side of Equation (3) is negligible if $v_d << V_P$. Furthermore, if a push-pull (differential) drive is used, this term results in a common-mode force and is cancelled to the first order. At mechanical resonance, the magnitude of the linear term in Equation (3) is multiplied by the Q-factor, from which it follows that the magnitude of the transfer function $T(j\omega_r) = X/v_D$ relating the phasor is placement X to phasor drive voltage $V_d$ at the resonant frequency $\omega_r$ is:

$$\left|\frac{X}{V_d}\right| = V_P \frac{Q}{k_{sys}} (\partial C/\partial x)_d \quad (4)$$

The transconductance of the resonant structure is defined by $Y(j\omega) = I_s/V_d$. Its magnitude at resonance can be found by substitution of Equation (4) into the phasor form of Equation (1):

$$\left|\frac{I_s}{V_d}\right| = \omega V_P^2 \frac{Q}{k_{sys}} (\partial C/\partial x)_s (\partial C/\partial x)_d \quad (5)$$

Planar electrode or ground plane 29d (FIGS. 1A and 1B) can be grounded or set to a dc potential in order to minimize parasitic capacitive coupling between the drive, feedback and sense ports. An additional function of this electrode is to suppress the excitation of undesired modes of the structure.

As noted, the motional current output from the resonator is electronically sensed by means of sense electrode 23. The motional current is applied to a transimpedence or transresistance amplifier 34, where it is converted to a voltage $v_o$. The voltage $v_o$ is fed back to the microresonator via feedback electrode 24. The drive voltage $v_d$ is applied to the resonator via drive electrode 22. The microresonator sums the drive voltage and the negative feedback signal, $v_{fb} = v_o$, closing the loop and reducing its own original Q. The Q of the microresonator is effectively controlled by the gain of amplifier 34, which can be made voltage controllable through the voltage $V_Q$.

The equivalent system block diagram for the architecture of FIG. 1A is shown in FIG. 2, where $Y_{d \cdot s}(j\omega)$ and $Y_{fb \cdot s}(j\omega)$ correspond to the microresonator drive port-to-output and feedback port-to-output transfer functions, respectively. Using FIG. 2, and modelling the resonator n port to m port transfer functions $Y_{m \cdot n}(j\omega)$ with the form $$Y_{m \cdot n}(j\omega) = \frac{1}{R_{xm \cdot n}} \frac{1}{1 + 2jQ(\Delta\omega/\omega_0)} \quad (6)$$

where $R_{xm \cdot n}$ is the equivalent series resistance of the resonator from any port m to any port n, and $\omega_0$ is the natural resonance frequency. The equivalent series resistance is discussed below in relation to FIG. 5. In the equations that follow, any port m or n may be d, s, or fb, corresponding to drive, sense, or feedback ports, respectively. Direct analysis of FIG. 2 yields $$\frac{V_o}{V_i}(j\omega) = \frac{R_{amp}/R_{xd \cdot s}}{1 + (R_{amp}/R_{xfb \cdot s})} \frac{1}{1 + 2jQ'(\Delta\omega/\omega_o)} \quad (7)$$

where $R_{amp}$ is the value of the transresistance or transimpedence of amplifier 34 and where $$Q' = \frac{Q}{1 + (R_{amp}/R_{xfb \cdot s})} \quad (8)$$

is the controlled value of the Q-factor. For large loop gain, the gain of Equation (7) reduces to ($R_{xfb \cdot s}/R_{xd \cdot s}$), which, as will be seen, is determined by the number of input and feedback fingers, and stays constant as Q is varied. The Q can be changed, as noted, by adjusting the gain of amplifier 34 through the voltage $V_Q$.

A schematic of the Q-control architecture for a two-port resonator 40 is shown in FIG. 3. Although FIG. 3 shows a resonator with equal numbers of drive and sense fingers, the number of fingers need not be equal. This resonator includes only a drive electrode 22 and a sense electrode 23. A summing amplifier 42 is provided to sum the input and feedback signals $v_d$ and $v_o$, respectively, which in FIG. 1A were summed by the multi-port resonator itself. The resistances $R_k$ and $R_f$ are variable. These resistances and $R_{sum}$ provide gain factors for signals applied to amplifier 42. Thus, they directly determine the Q and gain of the Q-control circuit.

FIG. 4 shows the single-ended system block diagram equivalent of the circuit of FIG. 3.

Referring to FIGS. 3 and 4, gain factor $$f = \frac{R_{sum}}{R_f}$$

and gain factor $$K = \frac{R_{sum}}{R_k}.$$

Using FIG. 4, and modeling the resonator with the transfer function $$Y(j\omega) = \frac{1}{R_{xd \cdot s}} \frac{1}{1 + 2jQ(\Delta\omega/\omega_o)}, \quad (9)$$

where $R_{xd \cdot s}$ is the equivalent drive-to-sense series resistance of the resonator. Direct analysis yields $$\frac{V_o}{V_i} = -\frac{K(R_{amp}/R_{xd \cdot s})}{1 + (R_{amp}/R_{xd \cdot s})f} \frac{1}{1 + 2jQ'(\Delta\omega/\omega_o)} \quad (10)$$

where $$Q' = \frac{Q}{1 + (R/R_{xd \cdot s})f} \quad (11)$$

is the controlled value of the Q-factor. For large loop gain, the gain of Equation (10) reduces to $$\frac{K}{f},$$

which in turn reduces to $$\frac{R_f}{R_k}.$$

In addition, Q' can be varied by changing $R_f$, with $R_k$ tracking this change.

The discussion of Q-control has so far concentrated on the lowering of Q through the application of a negative feedback voltage. By using a positive feedback, however, the Q of a resonator can be raised. Positive feedback implementations of Q-control can be realized by merely changing the amplification of amplifier 34 from positive to negative on the architectures of FIGS. 1A and 3.

Alternatively, and more conveniently, positive feedback may be obtained by interchanging finger connections as shown in FIG. 5. Specifically, the connections to microresonator 20 of FIG. 1A are reversed so sense electrode 23 becomes drive electrode 22' in the embodiment of FIG. 5. Similarly, drive electrode 22 of FIG. 1A becomes sense electrode 23', and the feedback electrode 24' is at the input or drive side of microresonator 20 where the input voltage $v_i$ is applied. The equation for controlled Q under positive feedback is:

$$Q' = \frac{Q}{1 - (R_{amp}/R_{xfb \cdot s})} \quad (12)$$

To design for a specific Q and voltage gain $$\frac{v_o}{v_d}$$

for the architecture of FIG. 1A, the equivalent drive-to-sense and feedback-to-sense series resistances, $Rxd \cdot_s$ and $R_{xfb \cdot s}$, respectively, of the resonator are required. To calculate these resistances, reference may be made to an equivalent circuit for a three-port micromechanical resonator. The equivalent circuit, as shown in FIG. 6, is biased and excited as in the circuit of FIG. 1A. The equations for the circuit elements are as follows:

$$R_{xn} = \frac{k_{sys}}{\omega_o Q V_P^2 (\partial C/\partial x)_n^2} \quad C_{xn} = \frac{V_P^2}{k_{sys}} (\partial C/\partial x)_n^2 \quad (13)$$

$$L_{xn} = \frac{k_{sys}}{w_o^2 V_P^2 (\partial C/\partial x)_n^2} \quad \phi_{mn} = \frac{(\partial C/\partial x)_m}{(\partial C/\partial x)_n}$$

$$C_{on} = C_{dc \cdot overlapn}$$

where n corresponds to the port of the resonator (drive, sense, or feedback) in question, $C_{on}$ is the overlap capacitance across the motionless shuttle and electrode fingers, and the $\Phi$'s represent multiplication factors for the current-controlled current sources shown in the figure. Typical element values for high-Q (Q=50,000) operation of a microresonator are $f_0$=20 kHz, $C_0$=15 fF, $C_x$=0.3 fF, $L_x$=100 KH, and $R_x$=500 K $\Omega$.

The equivalent drive-to-sense resistance of the microresonator may be calculated from the following equation:

$$R_{xd \cdot s} = \frac{v_d}{i_s} \quad (14)$$

Driving the equivalent circuit of FIG. 6 at the input port d and grounding the other ports, the output motional current $i_s$ at resonance is:

$$i_s = \phi_{sd} i_{xd} \quad \text{and} \quad i_{xd} = \frac{v_d}{R_{xd}} \quad (15, 16)$$

Applying Equation (15) to (14), gives:

$$R_{xd \cdot s} = \frac{R_{xd}}{\phi_{sd}} \quad (17)$$

similar analysis yields $$R_{xfb \cdot s} = \frac{R_{xfb}}{\phi_{sfb}} \quad (18)$$

To maximize the range of Q-control afforded by a given amplifier 34, the loop gain of the circuit, $A=(R_{amp}/R_{xfb \cdot s})$, should have a wide range. Thus, $R_{xfb \cdot s}$ should be minimized, which in turn requires that $R_{xfb}$ be minimized and $\Phi_{sfb}$ be maximized. Reduction in $R_{xfb}$ can be achieved by increasing the number of feedback fingers, decreasing the gaps between these fingers, and increasing finger thickness. $\phi_{sfb}$ is increased with similar modifications to the output fingers.

The number of input and feedback fingers also determines the gain of the Q-control circuit. Using Equation (17) and (18), the equation for gain at resonance is:

$$\left. \frac{v_o}{v_d} \right|_{\omega=\omega} = \frac{R_{xfb \cdot s}}{R_{xd \cdot s}} = \frac{R_{xbs}}{\Phi_{sfb}} \frac{\Phi_{sd}}{R_{xd}} = \frac{(\partial C/\partial x)_d}{(\partial C/\partial x)_{fb}} = \frac{N_d}{N_{fb}} \quad (19)$$

where $N_d$ and $N_{fb}$ are the number of input and feedback fingers, respectively. The last equality assumes identical finger gaps and thicknesses for both ports. Thus, the gain is determined by resonator geometry and is independent of variables which determine the controlled Q.

FIG. 3 presented a schematic of Q-control using a two-port microresonator, two amplifiers, and linear resistors. In order to implement variability of Q through voltage control, metal oxide semiconductor resistors (MOS) can replace the linear resistors of FIG. 3. The value of resistance realized by an MOS resistor can be varied through variation of the gate voltage of such devices. However, MOS resistors suffer from the drawback that they are less linear than their passive counterparts. In order to linearize MOS resistors, a balanced architecture must be used.

Such a balanced architecture is shown in FIG. 7, which illustrates Q-control using MOS resistors and a four-port microresonator 50. The microresonator 50 is similar in construction to microresonator 20 in that it includes movable and stationary, interdigitated fingers forming differential drive and sense electrodes 52 and 54, respectively. As in the embodiment of FIG. 1A, stationary electrode fingers 55 are anchored to the overlayers 29b and 29c (see FIG. 1B) at the darkly shaded regions or anchor points 56. The movable fingers 57 are suspended above the ground plane by means of the folded beam suspension arrangement 58.

Drive voltages $v_{i(-)}$ and $v_{i(+)}$ are applied to the drive electrodes. The output voltages $v_{o(-)}$ and $v_{0(+)}$ represent amplifications of the signals sensed by sense electrodes 54. Since the shuttle and its fingers are electrically connected to the ground plane, they are at the same voltage, $V_P$, as the ground plane.

The architecture of FIG. 7 also utilizes metal oxide semiconductor (MOS) resistors $M_{Q1}$, $M_{Q2}$, $M_{K1}$, $M_{K2}$, $M_{sum1}$, and $M_{sum2}$. Such resistors are normally nonlinear, unless operated in a fully balanced architecture, such as that depicted in FIG. 7. Fully balanced operation minimizes the even ordered harmonics of the MOS resistor voltage-to-current response, thus greatly reducing the total nonlinearity in such devices. In FIG. 7, MOS resistors $M_{Q1}$ and $M_{Q2}$ serve to feed back the output signal $v_o$ with the appropriate gain factor $f=R_{sum}/R_{Qn}=(W/L)_{Qn}/(W/L)_{sumn}$, (see FIG. 4) where n is either 1 or 2, to the summing amplifier composed of balanced operational amplifier 62 and shunt—shunt MOS resistors $M_{sum1}$ and $M_{sum2}$. Note that gain factor f is determined by a ratio of MOS W/L's, which are the width over length ratios, and thus can be accurately set to a 0.2% or better tolerance using integrated circuit processes. MOS resistors $M_{K1}$ and $M_{K2}$ direct the input signal $v_i$ with the appropriate gain factor $K=R_{sumn}R_{Kn}=(W/L)_{Kn}/(W/L)_{sumn}$ to the summing amplifier to be summed with the negative feedback signal from MOS resistors $M_{Q1}$ and $M_{Q2}$. This summation completes the feedback loop for Q-control as in the block diagram for the equivalent single-ended version given in FIG. 3. The equations dictating Q-control for the balanced version of FIG. 7 are similar to those for FIG. 3, Equations (9) through (11), except for changes in the drive-to-sense resistance $R_{xd \cdot s}$, which must now account for the four-port nature of the resonator, and can be easily obtained using an analysis similar to that of Equations (13) through (18).

The circuitry further includes a balanced transimpedance or transresistance amplifier 60, which may or may not be variable. As shown, it is voltage-controllable via $V_R$.

For large loop gain, the gain in the scheme of FIG. 7 is determined by a ratio of MOS resistor gate width over gate length ratios $$\left(\frac{W}{L}\right)'s,$$

specifically $$\frac{(W/L)_K}{(W/L)_f},$$

wherein $K=R_{sum}/R_K=(W/L)_{Kn}/(W/L)_{sumn}$ and $f=R_{sum}/R_Q=(W/L)_{Qn}/(W/L)_{sumn}$. The gain of the stage in FIG. 7 stays constant with changing Q, since the channel resistances of $M_Q$ and $M_K$ track with $V_Q$.

Any Q may be realized using the embodiment discussed herein; thus, any bandpass biquad transfer function may be implemented. Since both the Q and gain of the stage of the embodiment of FIG. 7 depend mainly on ratios of the MOS resistors, which can be made to tolerances as low as 0.2%, this scheme, as well as the other embodiments of the present invention, is quite suitable for bulk fabrication. The initial high Q of microresonators allows for the fabrication of high-Q filters. In addition, the Q of the Q-control circuit and thus the bandwidth of a filter in which the circuit may be incorporated, may be adjusted by changing the loop gain of the circuit. This can be achieved by merely changing a single voltage $V_Q$ which controls the value of the channel resistance realized by, for example, resistors $M_{Q1}$ and $M_{Q2}$. This simple control of a filter bandwidth encourages adaptive circuit techniques for very precise control of filter characteristics.

As shown in FIG. 8, the Q-control scheme of the embodiment of FIG. 7 can be further simplified by using additional microresonator ports to sum the input and feedback signals, removing the requirement for summing amplifier 62. In this scheme, only one transresistance amplifier 60 is required per two filter poles.

As shown in FIG. 8, microresonator 70 is a six-port resonator using one balanced transresistance amplifier 60. The drive voltages $v_{i(+)}$ and $v_{i(-)}$ are applied to drive electrodes 71 and 72 which, as in the other embodiments, comprise stationary and movable interdigitated fingers. The output signal from amplifier 60, voltages $v_0(+)$ and $v_0(-)$, is channeled directly back to resonator 70 via feedback electrodes 73 and 74. The output at sense electrodes 75 and 76 is applied to the negative and positive inputs, respectively, of amplifier 60. Q is controlled by varying the transresistance (transimpedance) of amplifier 60, which is controllable via the control voltage $V_Q$.

By expanding Equation (8) using elements from above analyses resulting from the equivalent circuit of FIG. 6, it can be shown that the value of controlled Q is independent of the original Q. Doing this, the controlled Q for the embodiment of FIG. 1A is:

$$Q' = \frac{[M_{eff}k_{sys}]^{\frac{1}{2}}}{V_P^2 \left(\frac{\partial C}{\partial x}\right)_{fb} \left(\frac{\partial c}{\partial x}\right)_s R_{amp}}, \quad (20)$$

where $M_{EFF}$ is an effective mass of the resonator (including support beams and folding truss), $k_{sys}$ is the system spring constant, $V_P$ is the applied dc-bias, and $(\partial c/\partial x)_{fb}$ and $(\partial c/\partial x)_s$ are the change in capacitance per displacement of the microresonator's feedback and sense ports, respectively. Equation (20) shows no dependence on the original Q, and thus, the Q-factor can be set irrespective, for example, of the ambient operating pressure.

A similar expansion applied to the architecture of FIG. 3 yields $$Q' = \frac{[M_{eff}k_{sys}]^{\frac{1}{2}}}{V_P^2 \left(\frac{\partial C}{\partial x}\right)_d \left(\frac{\partial c}{\partial x}\right)_s Rf}, \quad (21)$$

which is also independent of the original Q.

As discussed, by using positive feedback, the Q of a resonator can be raised. Positive feedback implementations of Q-control can be realized by merely changing the transresistance amplification $R_{amp}$, from positive to negative, in the embodiments of FIGS. 7 and 8. Alternatively, positive feedback can also be achieved by keeping the $R_{amp}$ of amplifier 60 positive and interchanging (crossing) any two parallel leads in the feedback loop. For the one amplifier Q-control version (FIG. 8), the equation for controlled Q under positive feedback is $$Q' = \frac{Q}{1 - \frac{R_{amp}}{R_{xfb \cdot s}}}, \quad (22)$$

where $R_{rfb \cdot s}$ is the equivalent series resistance from the feedback port to the sense port. For positive feedback, the controlled Q is dependent upon the original Q.

The Q-controlled microresonator architectures described above, the embodiments of FIGS. 1, 3, 7 and 8, can implement any arbitrary bandpass biquads transfer function. Thus, they can be used as biquad stages in various filter architectures such as follow the leader feedback (FLF), coupled (or cascaded) biquad, or other multiple-loop feedback techniques. FLF designs are quite desirable, since they have low element sensitivities, comparable or superior to those of leapfrog designs.

A FLF version of a filter, represented generally by reference numeral 75, is shown in FIG. 9, and the equivalent system block diagram for a general FLF filter design is shown in FIG. 10A. In filter 75, the bandpass biquad stages 80, 81 and 82 all have identical center frequency and Q (but differing gains $K_i$). They may be implemented using any of the Q-control microresonator architectures of FIGS. 1, 3, 7, or 8.

Filter 75 includes MOS transistors $M_{KA}$, $M_{KB}$, $M_{FBA}$, $M_{FBB}$, $M_{F3A}$, $M_{F2A}$, $M_{F2B}$, $M_{F3B}$, $M_{B1A}$, $M_{B2A}$, $M_{3A}$, $M_{B1B}$, $M_{B2B}$, $M_{B3B}$, $M_{FFA}$, and $M_{FFB}$ connected to implement the feedback in the total system. The transistors $M_{fnx}$, where n can be 2 or 3 and x can be A or B in correspondence with FIG. 9, are used as variable MOS resistors to realize the feedback gains $F_n$ depicted in FIG. 10A. The MOS resistors are directed into operational amplifier 76, which is connected as a summing amplifier with MOS resistors $M_{FBA}$ and $M_{FBB}$. In this configuration, the feedback gains are given by $F_n = (W/L)_{FBx}/(W/L)_{Fnx}$, where x can be either A or B and n can be either 2 or 3 in correspondence with FIG. 9. The $M_{Kx}$ are also used as MOS resistors going into the amplifier 76. They realize the gain factor K in FIG. 10A via the equation $K = (W/L)_{FBx}/(W/L)_{Kx}$, where again, x can be either A or B in correspondence with FIG. 9.

The transistors $M_{Bnx}$, where n can be 1, 2 or 3 and x can be A or B in correspondence with FIG. 9, are used as variable MOS resistors to realize the feedforward gains $B_n$ depicted in FIG. 10A. The MOS resistors are directed into operational amplifier 72, which is connected as a summing amplifier with MOS resistors $M_{FFA}$ and $M_{FFB}$. In this configuration, the feedforward gains are given by $B_n = (W/L)_{FFx}/(W/L)_{Bnx}$, where x can be either A or B and n can be 1, 2, or 3, in correspondence with FIG. 9. Both the center frequency and bandwidth of the filter are variable via the single voltage $V_Q$.

Filter 75 uses its three identical microresonator biquads 80, 81 and 82 to realize a sixth order bandpass filter with equiripple passband and stopband. Loss pole locations are determined by the loop gains of balanced feedback loops 84a and 84b, and 85a and 85b, while stopband zeros are determined by the feedforward coefficients realized by the $M_{FFx}$'s and $M_{Bnx}$'s. The bandpass stages 80, 81 and 82 determine the center frequency and Q-factor of the filter.

In filter 75, the feedback gains $-F_2$, $-F_3$ and $-F_n$ (FIG. 10A) are implemented by ratios of MOS W/L's as are the biquad gains $K_i$. Since the Q of the biquads 80, 81 and 82 are controllable via the voltage $V_Q$ (FIGS. 1, 3, 7 or 8), the bandwidth of the whole filter is likewise controllable via this single voltage.

Pole/zero precision for the filter should be comparable to that for switched-capacitor circuits, since poles and zeros can be made dependent on microresonator matching and ratios of the MOS resistors W/L's, i.e., $(W/L)_2/(W/L)_1$, in much the same way capacitor ratios determine the characteristics of switch capacitor filters. Fabrication of such filters may be achieved through a combination of standard CMOS integrated circuit and micromachining technologies, such as the recent Modular Integration of CMOS and Sensors (MICS) process.

FIG. 11 shows simulated responses, $$\frac{v_o}{v_i}$$

in decibels (db), using SPICE for filter 75, for different values of $V_Q$, $V_{Q1}$ and $V_{Q2}$, demonstrating bandwidth control and the potential for high Q. The filter Q for the solid plot is about 250, and the bandwidth is less than 100 Hz.

The dynamic range of the high-Q filter 75 has been calculated to be much higher than that of its high-Q active RC counterparts, i.e. switched capacitor, MOSFET-C and $g_m$-C filters. Such active RC filters, which are designed via operational simulation of LC ladders, have reduced dynamic range when implementing high-Q filters, because the noise per stage is amplified by a factor approximately equal to the filter Q. This comes about because the large currents and voltages present in high-Q LC circuits are represented by integrator outputs in the active RC equivalent; thus, attenuation must be provided at appropriate nodes to prevent saturation. Q-controlled microresonator filters do not share this drawback, because the high-Q elements the microresonators, a re effectively passive transconductance devices.

The noise block diagram of FIG. 10B, wherein the block 100 schematically represents a two-port resonator, such as in FIG. 3, can be used to calculate the output noise per Q-control stage. Straightforward analysis yields $$\overline{V_{nk}} = \frac{K_k}{1 + 2jQ'(\Delta\omega/\omega_o)} \cdot \overline{V_{ak}} + \frac{K_k R_x}{A} \frac{1 + 2jQ(\Delta\omega/\omega_o)}{1 + 2jQ'(\Delta\omega/\omega_o)} \cdot \overline{i_{bk}} \quad (23)$$

which at resonance, reduces to $$\overline{V_{nk}} = K_k \cdot \overline{V_{ak}} + \frac{K_k R_x}{A} \cdot \overline{i_{bk}}. \quad (24)$$

where $R_x$ is the equivalent drive-to-sense resistance of resonator 100. Equation (24) shows that noise in the high-Q filter is not amplified by filter Q.

Using Equation (24), the dynamic range of filter 75 (FIG. 9), having a bandwidth of 56 kHz and a 5V supply, is calculated to be in excess of 90 dB.

The amplifiers 34 and 60 represent single-ended and balanced versions of transimpedance or transresistance amplifiers of any general design. The design could be as simple as shunt—shunt feedback applied to an operational amplifier or commercial designs of transimpedance amplifiers used in optical receivers.

If it is desired to obtain large loop gains for the Q-control architectures described above, amplifiers 34 or 60 should be designed for maximum gain bandwidth product. One such design which utilizes CMOS transistors, but can use any technology, be it bipolar, BiCMOS, etc., is shown in FIG. 18. (MOS technology has the advantage that the input noise current into the gate of a transistor is minuscule at lower frequencies.) In this design, which is fully balanced, transistors M1 through M9, as shown in FIG. 18, comprise a current feedback pair input stage, which has the advantages of low input noise current and large gain bandwidth product. Transistors M10 through M25 comprise a video amplifier second stage, featuring a current feedback pair architecture for high bandwidth. The bandwidth of this amplifier is large because all nodes in its signal path are low impedance nodes. Finally, transistors M26 through M29 make up a common-mode feedback loop, which minimizes the common-mode gain of the amplifier and forces the output dc level to the "Balancing Level" voltage. All transistors in FIG. 18 operate as MOS transistors in the saturation region, except for $M_{f1}$, $M_{f2}$, $M_{f3}$, and $M_{f4}$, which operate as MOS resistors for the current feedback pairs in which they operate. The gain of the amplifier is varible through voltage $V_{QA}$ and $V_{QB}$, or $V_Q$ if these nodes are tied as shown by the dashed connections.

Using the de sign of FIG. 18, gains of over 100 mega-ohms with bandwidths over 100 MHz can be attained, depending upon the technology being used. A single-ended version of the amplifier follows readily from FIG. 18.

Because of squeeze-film damping, Couette flow, or similar fluid-based damping mechanisms, the quality factor of a microresonator is strongly dependent upon the ambient pressure in which it operates. In addition, the intrinsic Q of a microresonator is a function of the anchor and is also temperature dependent. For lateral electrostatic-comb driven resonators, the Q ranges from under 50 in atmosphere to over 50,000 in 10 mTorr vacuum. Since the operational pressure for a microresonator is not easily controlled, a Q-control method independent of the original Q of the resonator is desirable.

The controlled Q in the resonators of the present invention can be shown to be independent of the original resonator Q, and thus, of ambient pressure, using the equivalent series resistance discussed above. Inserting Equation (18) in (8) and assuming sufficient loop gain (i.e. $(R_{amp}/R_{xfb}\cdot s) \gg 1$) yields $$Q' = \frac{QR_{xfb}\cdot s}{R_{amp}} \quad (25)$$

$$= \frac{k_{sys}}{\omega_o V_P^2 \left(\frac{\partial C}{\partial x}\right)_{fb}^2 \phi_{sfb} R_{amp}}$$

$$= \frac{[M_{eff} k_{sys}]^{1/2}}{V_P^2 \left(\frac{\partial C}{\partial x}\right)_{fb} \left(\frac{\partial C}{\partial x}\right)_s R_{amp}}$$

where the equation for the first mode resonance frequency $$\omega_o = \sqrt{k_{sys}/M_{eff}}$$

has been inserted. In the above equations, $M_{eff}$ is an effective mass of the resonator, including the support beams and folding truss. Note that the controlled quality factor Q' depends only upon the transresistance amplification $R_{amp}$, the bias voltage $V_P$, and microresonator geometry. It has no dependence on the original Q provided there is sufficient loop gain.

Initial experimental verification of the feasibility of the filters of the present invention has been achieved by demonstrating the Q-control techniques described above. FIG. 12 shows measured microresonator transconductance spectra under different loop gains, varied by changing the value of the transresistance of amplifier 34 in the circuit of FIG. 1A. As shown, the measured values of Q are 53,000 for $R_{amp}=1$ mega-ohm and 18,000 for $R_{amp}=3.3$ mega-ohms. The measurements were made under vacuum at a pressure of 10 mTorr.

FIG. 13 presents experimental verification that the value of the controlled Q is invariant under changing ambient pressures, being dependent only on the Q-controlling feedback set by transresistance (transimpedance) amplifier 34 (FIG. 1A). Without Q-control, the original Q at 8 mTorr is 53000 and that at 50 mTorr is 84000. With Q-control, the Q for both cases is 18000.

The present invention also contemplates different methods for voltage-controlled tuning of the resonance frequency of a microresonator, and thus, of a filter in which it may be used. One method involves the introduction of some nonlinearity into the voltage-to-force transfer function of the microresonator, which gives rise to a bias dependence of the resonance frequency. For an electrostatic-comb driven lateral micromechanical resonator, the most convenient way to do this is to use sloped drive fingers, as shown in FIGS. 14A and 14B.

Specifically, sloped drive fingers 92 of microresonator 90 form part of the interdigitated fingers (comb) of the frequency-pulling electrode pair 91a. As shown, drive electrodes 91 and 93 also include straight, movable electrode fingers 94 and straight, fixed electrode fingers 95. The sense electrodes are represented by reference numeral 96, and as discussed above, include fixed and movable fingers.

As shown in FIG. 14B, sloped drive fingers 92 may be sloped at an angle θ. A distance $d_0$ may separate sloped fingers 92 and straight fingers 94. An overlap $L_0$ may exist between sloped fingers 92 and straight fingers 94. By way of example, θ can be about 15°, $d_o$ about 2 μm, and $L_0$ about 20 μm. The straight movable fingers 94 are displaced in the x direction when the resonator is driven by the drive electrodes 91 and 93. The straight fingers 95 of drive fingers 91 and 93 can also be sloped to enhance the frequency-pulling effect. The sloped drive fingers introduce a nonlinear voltage-to-force transfer function, which in turn results in a bias dependent resonance frequency, allowing center frequency tunability. Sloped drive fingers cause the capacitance variation with displacement $\partial C/\partial x$ to be nonlinear, which makes the voltage-to-force transfer function nonlinear. The force versus voltage transfer function is given in phasor form by:

$$F_d = \frac{N_p \epsilon_o \theta V_P^2}{d_o^2} X - 2N_d V_P (\partial C/\partial X)_{lin} V_d, \quad (26)$$

where $N_d$ is the number of shuttle or movable fingers surrounded by straight drive, fixed fingers, $N_p$ is the number of shuttle fingers surrounded by sloped fingers, and $(\partial C/\partial x)_{lin}$ corresponds to the straight drive fingers. Using Equation (26) to derive the equation for Y(jω)=

$$Y(j\omega) = \frac{I(j\omega)}{V_d(j\omega)}$$

and then extracting the resonance frequency, the following is obtained:

$$\omega_1' = \omega_1 \sqrt{1 - g_{sl'}} \quad (27)$$

where $$g_{sl} = \frac{N_p \epsilon_o h \theta V_P^2}{d_o^2 k_{sys}}.$$

Equations (27) and (28) indicate that resonator resonance frequency can be pulled by simply varying the bias voltage $V_p$.

Sloped drive fingers are not the only way to introduce a nonlinearity into the voltage-to-force transfer function. A third polylayer as shown in FIGS. 15A and 15B, would also work, as would other geometrical configurations.

Here, microresonator 100 includes sense electrodes 101 and differential drive electrodes 102. The fixed fingers 103 of one electrode pair 110 are triangular in shape and include a third polylayer 107 wherein a first polylayer 109 forms a shuttle ground plane 105a and an electrode ground plane 105b, and a second polylayer 108 forms the movable fingers 104. As shown, fingers 104 (second polylayer 108) are disposed between third polylayer 107 and electrode ground plane 105b.

The third polylayer 107 and electrode ground plane 105b introduce a non-linear variation of the voltage-to-force transfer function of the resonator, i.e., introduces a nonlinear capacitance versus displacement transfer function, allowing for resonance frequency pulling via variation of the applied voltage $v_{Af}$. The first polylayer 109 forming electrode ground plane 105b matches the third polylayer 107 under the triangular-areas to balance vertically-directed electrostatic forces, preventing the possible pull-in of the suspended or movable fingers 104.

Another method for tuning the center frequency involves pulling the "springs" (beams) of a microresonator 110, as shown in FIG. 16A. The tension in the suspending springs is varied by electrostatically pulling on the truss support, where the supporting beams 114a–114d and 115a–115d fold. The pulling force is applied via voltage source ($V_{Af}$) which is different from bias voltage $V_p$ and applied to spring-pulling electrodes 116 and 118 located on opposite sides of folded beam arrangement 112.

Initial analysis indicates that for a parallel-plate electrostatic pull with a gap $g_o$=0.5 μm between the electrode 116 or 118 and the spring-folding truss 119 and capacitor area of 400 μm², a force of 17.7 μN is generated for an applied pulling voltage of 50 volts ($V_{Af}$) corresponding to a 1% change in resonance frequency. Smaller gaps and larger capacitor area, of course, will result in much larger frequency shifts, as large as 10%. FIG. 16B shows a plot of resonance frequency versus frequency-pulling voltage $V_{Af}$F for a fabricated device of the type shown in FIG. 16A. For $V_{AF}$=40V, a 0.2% shift in frequency in measured.

The variation of filter characteristics with temperature is determined mainly by the dependence of resonator resonance frequency on temperature. In macroscopic crystal oscillator circuits, two methods for minimizing the temperature dependence of the crystal resonance frequency are: (1) temperature compensation, where circuit techniques which pull the frequency of resonance are used to compensate for frequency changes due to temperature variation; and (2) temperature control, where the temperature of the system is held at a certain point in an attempt to eliminate from the start the mechanism for frequency variation.

Although temperature control can achieve better frequency stability than compensation, the former has been less frequently used due to the following drawbacks: (1) a large volume is required for thermal isolation; (2) a warm-up time for the oven is needed; and (3) the power consumption, particularly in cold environments, is large (up to 10 watts (W)).

Thus, temperature compensation has proven to be the predominant technique for achieving temperature stable oscillators in the macroscopic world.

For microresonators, however, there is a strong potential for reversing the situation. Micro-miniaturization can eliminate many of the drawbacks noted above. In particular, microminiaturization offers, of course, smaller volume, and this combined with the potential for using a vacuum shell and/or special micromachining processing techniques for thermal isolation, solves all of the above problems, since orders of magnitude less warm-up time and power consumption are required to stabilize the temperature of micron-sized structures.

Thus, for a micro-oven control, the resonance frequency of a micromechanical resonator may be stabilized by using heating and sensing resistors in a feedback loop to maintain a constant temperature. Such a scheme is depicted in FIG. 17A.

In this embodiment, the voltage $V_{th}$ is initially high and causes the amplifier 121 to supply current to the heating resistors 122. As the temperature rises, the resistance of thermistors 123, which may be polysilicon resistors, decreases, causing $V_{th}$ to rise to the optimum value $V_{ref}$, where the feedback loop, represented by connection 124, attempts to stabilize $V_{th}$. The temperature of the system is, thus, set by $V_{ref}$, and this temperature may be chosen at a point in the fractional frequency change versus temperature curve where the slope is zero, and the temperature exceeds room temperature.

The power consumption required to maintain the specified temperature is determined by the thermal loss in the system, which should be minimized to minimize the power requirement. Herein lies the main advantage of miniaturized resonators, since it is in the reduction of thermal loss where microminiaturization proves most rewarding.

In the embodiment of FIG. 17A, microresonator 120, heating resistors 122, and thermistors 123 are fabricated on a microplatform 125, which is connected to a substrate (not shown) by only thin supporting beams 126. Designs where the filter circuitry and micro-oven control circuits are fabricated on the microplatform are possible as well. Such a microplatform for thermal isolation purposes has been previously considered wherein bulk micromachining processes were used to achieve a silicon nitride microplatform. Experimental measurements found that the power required to maintain 300° C. was only 8 mW, and the thermal time constant was only 3.3 msec. These figures are to be compared with up to 10 W and 15 to 30 minutes for macroscopic temperature-controlled quartz crystal oscillators. Evidently, several orders of magnitude improvement in power dissipation and warm-up time can be achieved with microresonators. A scanning electron micrograph (SEM) of a resonator fabricated on top of a thermally-isolated microplatform is shown in FIG. 17B.

Using additional ports on a micromechanical resonator, electrostatic feedback techniques which control the Q of the microresonator have been demonstrated. Such Q-control techniques can be applied to passband smoothing of micromechanical filters and/or Q-controlled biquads in biquad filter architectures. The solid curves in FIGS. 19A and 19B show frequency versus amplitude responses for a fourth order parallel, microresonator filter as described in the above-identified application entitled "Microelectromechanical Signal Processors." FIG. 19A also shows the responses of the two resonators, resonator 1 and resonator 2, which constitute the filter. Immediately after fabrication, and in a vacuum, the Q's of the resonators constituting the filter are large and unpredictable, resulting in a filter frequency response similar to the one in FIG. 19A. By applying Q-control to each resonator, as described herein and in accordance with the present invention, the passband may be corrected to be flat as shown in FIG. 19B.

FIG. 20 shows an implementation of such passband correction. In FIG. 20, two four-port resonators are represented by equivalent circuit diagrams 130, where the central structure depicts the shuttle and supporting springs, and the vertical lines represent ports, and it is understood that this resonator circuit diagram can be generalized to any number of ports. In the scheme of FIG. 20, each resonator has one drive port 136 and 137, two sense ports 132, 135 and 133, 138, and one feedback port 139 and 134. As in the normal parallel microresonator bandpass filter implementation, the drive voltages $v_{i(+)}$ and $V_{i(-)}$ to each resonator are 180° out of phase. Motional current from sense ports 132 and 133 is summed and then amplified to a voltage by amplifier 34, generating the output of the filter. The quality factor of each resonator is controlled by negative feedback loops involving negative transimpedance (or transresistance) amplifiers 131, which amplify sense currents from ports 135 and 138, and feed them back to ports 134 and 130, as shown in FIG. 20. The Q-control implementation operates as discussed above. Using the implementation of FIG. 20, corrected bandpass filter responses as shown in FIG. 19B can be obtained.

Although Q-control has been discussed using multiport resonators, single-port resonator implementations are also possible. FIG. 21 shows a schematic of Q-control for a single-port resonator. Here, single-port resonator 140 is driven at port 143. The motional current resulting from capacitive variation of port 143 flows through the resonator 140 and into node 144, and is 90° phase-shifted from the drive voltage at port 143. The current is sensed directly from the resonator via capacitive amplifier 141. The lead to node 144 from resonator 140 is electrically connected to the resonator ground plane (not shown). As discussed, the ground plane and the resonator shuttle are at the same voltage potential. Capacitive amplifier 141 has amplification factor $C_{amp}$ and provides an additional +90° phase-shift which allows negative feedback of the output signal $v_0$ to the summing amplifier consisting of operational amplifier 42 and resistor $R_{sum}$. Reverse-biased diode 142 is provided to bias node 144 to the dc voltage $V_p$.

With these changes, the circuit of FIG. 21 then operates as the previous embodiments, with control of Q through variation of $R_x$ and $R_Q$, which track each other.

The ability to control Q to the above precision also has implications beyond this. For example, using the Q-control architecture of FIG. 3, changes in pressure can be quantified by measuring the feedback signal at the output of the summing amplifier, which adjusts to maintain constant Q under varying pressure. Such a Q-balanced resonator pressure sensor would have the advantage of automatic limiting of the resonator amplitude, and thus, would have a wide sensing range.

The present invention has been described in terms of a number of different embodiments. The invention, however, is not limited to the embodiments depicted and described. Rather, the scope of the invention is defined by the appended claims.

What is claimed is:

1. A voltage-tunable microresonator system, comprising:
   a microresonator micromachined on a substrate, said microresonator having a nonlinear voltage-to-force transfer function; and
   means for biasing said microresonator with a variable bias voltage.

2. The microresonator system of claim 1, wherein said microresonator includes sloped drive fingers.

3. A tunable microresonator, comprising:
   a substrate;
   a substantially rigid member; and
   a flexible member connecting said substantially rigid member to said substrate, said flexible member having a variable equilibrium tension.

4. The tunable microresonator of claim 3, wherein said variable equilibrium tension is varied by pulling said flexible member.

5. The tunable microresonator of claim 4, wherein said flexible member is pulled electrostatically.

6. A tunable microelectromechanical resonator comprising:
- a substrate;
- at least one fixed electrode anchored to said substrate and said electrode comprising a polylayer suspended above said substrate and a ground plane covering said substrate;
- a movable plate having a portion thereof disposed between said polylayer and said substrate; and
- a flexible member connecting said plate to said substrate.

7. A method for applying a weighted sum of a plurality of signals as a force to a micromachined member, comprising:
- providing a comb structure having fingers patterned on said member;
- providing one electrode for each signal, each said electrode comprising combs with a plurality of fingers interdigitated with the fingers of said member, the number of fingers of each comb being proportional to the weight of the signal; and
- applying said signals between said electrodes and said member.

* * * * *